US009754535B2

(12) United States Patent
Ohara et al.

(10) Patent No.: US 9,754,535 B2
(45) Date of Patent: Sep. 5, 2017

(54) DISPLAY DEVICE AND METHOD FOR DRIVING DISPLAY DEVICE

(71) Applicant: Sharp Kabushiki Kaisha, Osaka-shi, Osaka (JP)

(72) Inventors: Masanori Ohara, Osaka (JP); Noboru Noguchi, Osaka (JP); Noritaka Kishi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 32 days.

(21) Appl. No.: 14/771,533

(22) PCT Filed: Feb. 20, 2014

(86) PCT No.: PCT/JP2014/054013
§ 371 (c)(1),
(2) Date: Aug. 31, 2015

(87) PCT Pub. No.: WO2014/162792
PCT Pub. Date: Oct. 9, 2014

(65) Prior Publication Data
US 2016/0012774 A1   Jan. 14, 2016

(30) Foreign Application Priority Data

Apr. 2, 2013   (JP) .................................. 2013-076856

(51) Int. Cl.
*G09G 3/30*   (2006.01)
*G09G 3/3233*   (2016.01)
(Continued)

(52) U.S. Cl.
CPC ......... *G09G 3/3233* (2013.01); *G09G 3/2025* (2013.01); *G09G 3/3225* (2013.01);
(Continued)

(58) Field of Classification Search
CPC .. G09G 3/2022; G09G 3/3208; G09G 3/3225; G09G 3/3233; G09G 2300/0452;
(Continued)

(56) References Cited

U.S. PATENT DOCUMENTS

| | | | | |
|---|---|---|---|---|
| 5,748,160 A | * | 5/1998 | Shieh | G09G 3/2011 345/210 |
| 2002/0041278 A1 | * | 4/2002 | Matsueda | G09G 3/20 345/204 |

(Continued)

FOREIGN PATENT DOCUMENTS

| | | |
|---|---|---|
| JP | 2002-175045 A | 6/2002 |
| JP | 2005-148749 A | 6/2005 |

(Continued)

OTHER PUBLICATIONS

International Search Report PCT/ISA/210 for International Application No. PCT/JP2014/054013 dated Mar. 31, 2014.
(Continued)

*Primary Examiner* — Michael J Eurice
(74) *Attorney, Agent, or Firm* — Harness, Dickey & Pierce, P.L.C.

(57) ABSTRACT

In a display device that has self light-emitting type display elements and that adopts time-division driving, power consumption is reduced over the conventional one. Each of emission lines is connected to the gate terminals of light-emission control transistors provided for organic EL elements of different light-emitting colors in three pixel circuits arranged side by side in an extension direction of scanning signal lines. When there is no change in image content throughout a period longer than or equal to a predetermined period during a time-division driving mode, an operating mode is switched to a pause driving mode. During the pause driving mode, emission drivers bring only first emission lines into a selected state, by which a still image with a ⅓
(Continued)

resolution of an image displayed during the time-division driving mode is displayed on a display unit. During a pause period, peripheral drivers go into a pause state.

19 Claims, 37 Drawing Sheets

(51) Int. Cl.
    *G09G 3/3225*     (2016.01)
    *G09G 3/3266*     (2016.01)
    *G09G 3/3258*     (2016.01)
    *G09G 3/20*     (2006.01)
    *G09G 3/3208*     (2016.01)
    *H01L 29/786*     (2006.01)

(52) U.S. Cl.
    CPC ......... *G09G 3/3258* (2013.01); *G09G 3/3266* (2013.01); *G09G 3/2022* (2013.01); *G09G 3/3208* (2013.01); *G09G 2300/0443* (2013.01); *G09G 2300/0452* (2013.01); *G09G 2300/0804* (2013.01); *G09G 2300/0814* (2013.01); *G09G 2300/0842* (2013.01); *G09G 2300/0861* (2013.01); *G09G 2310/0235* (2013.01); *G09G 2310/0286* (2013.01); *G09G 2330/021* (2013.01); *G09G 2340/0407* (2013.01); *G09G 2370/08* (2013.01); *H01L 29/7869* (2013.01)

(58) Field of Classification Search
    CPC ..... G09G 2310/0235; G09G 2330/021; G09G 2340/0407; H01L 29/7869
    See application file for complete search history.

(56) References Cited

U.S. PATENT DOCUMENTS

| | | | | |
|---|---|---|---|---|
| 2002/0051153 | A1* | 5/2002 | Hiyama | G09G 3/20 358/1.9 |
| 2003/0169247 | A1* | 9/2003 | Kawabe | G09G 3/342 345/204 |
| 2004/0066363 | A1* | 4/2004 | Yamano | G09G 3/3625 345/98 |
| 2005/0104817 | A1* | 5/2005 | Kwak | G09G 3/2022 345/76 |
| 2005/0104875 | A1* | 5/2005 | Kwak | G09G 3/3233 345/204 |
| 2005/0168491 | A1* | 8/2005 | Takahara | G09G 3/006 345/690 |
| 2005/0200573 | A1* | 9/2005 | Kwak | G09G 3/3233 345/76 |
| 2007/0152923 | A1* | 7/2007 | Baik | G09G 3/3233 345/76 |
| 2011/0074808 | A1* | 3/2011 | Huang | G09G 5/02 345/590 |
| 2011/0115839 | A1* | 5/2011 | Takahashi | H01L 27/1225 345/698 |
| 2011/0130981 | A1* | 6/2011 | Chaji | G09G 3/006 702/58 |
| 2011/0298775 | A1* | 12/2011 | Mori | G09G 3/3225 345/211 |
| 2012/0287144 | A1* | 11/2012 | Gandhi | G09G 3/2029 345/589 |

FOREIGN PATENT DOCUMENTS

| | | |
|---|---|---|
| JP | 2005-148750 A | 6/2005 |
| JP | 2005-266770 A | 9/2005 |
| JP | 2006-084758 A | 3/2006 |
| JP | 2009-134014 A | 6/2009 |
| JP | 2012-018386 A | 1/2012 |

OTHER PUBLICATIONS

Written Opinion of the International Searching Authority PCT/ISA/237 for International Application No. PCT/jp2014/054013 dated Mar. 31, 2014.

* cited by examiner

Fig.12

| R | | | G | | | | | B |
|---|---|---|---|---|---|---|---|---|
| R | | | G | | | | | B |
| R | | | G | | | | | B |

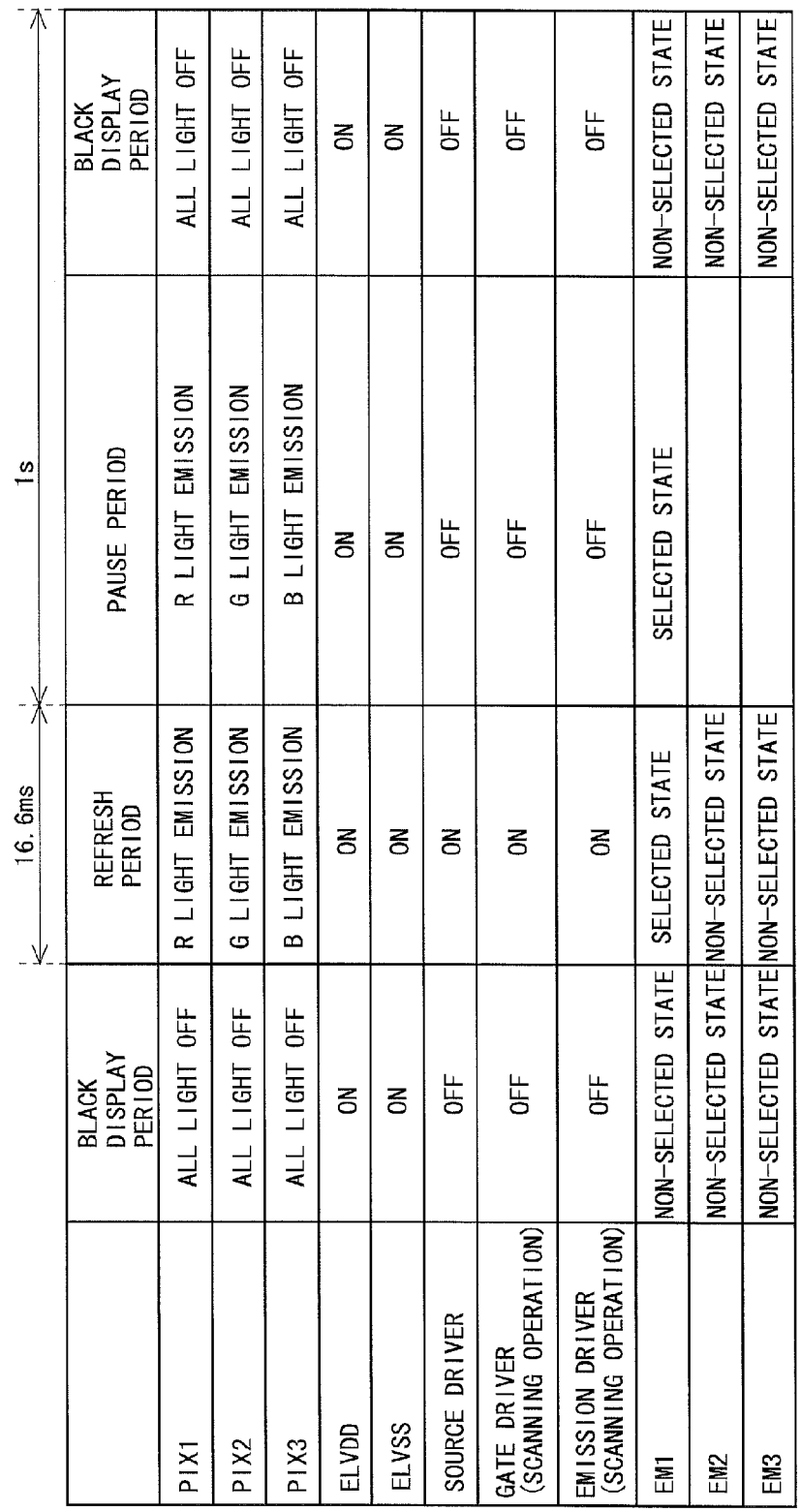

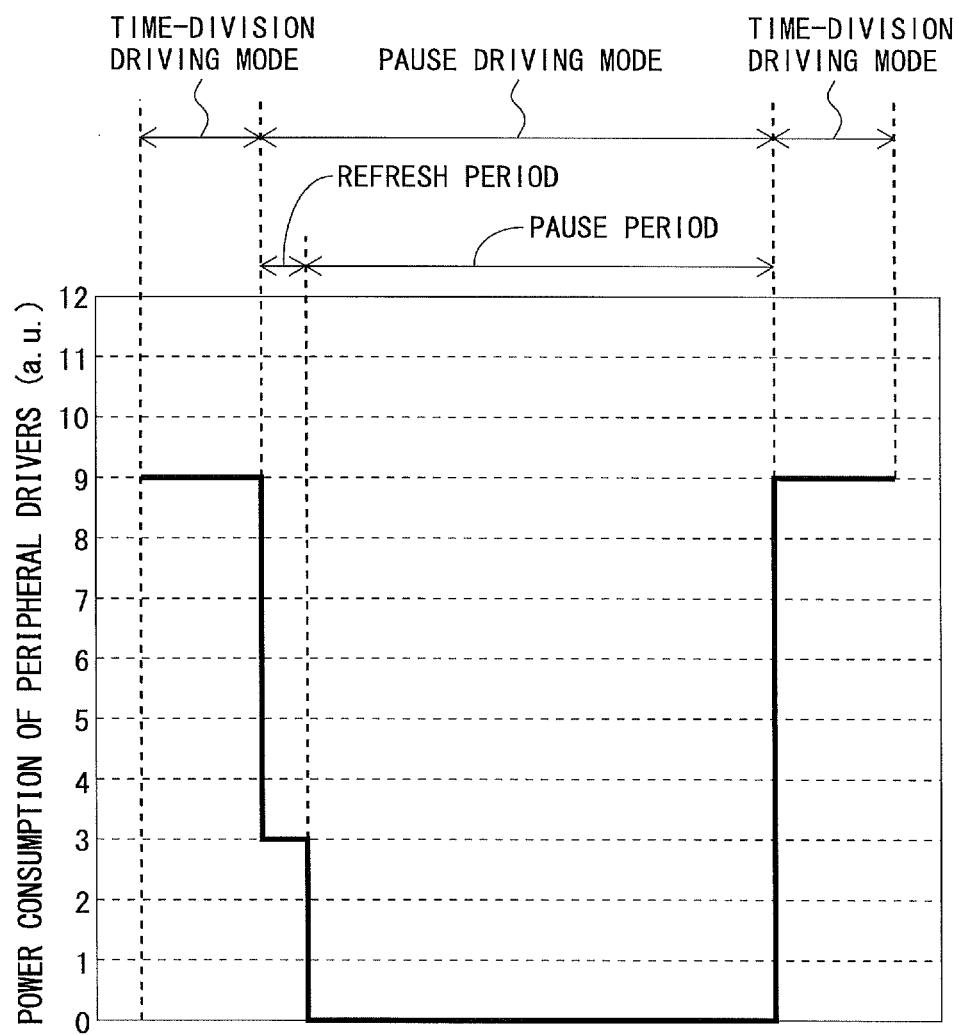

Fig.21

| DRIVERS | TIME-DIVISION DRIVING | | PAUSE DRIVING (PAUSE PERIOD) | |
|---|---|---|---|---|
| | DRIVING FREQUENCY (Hz) | POWER CONSUMPTION (W) | DRIVING FREQUENCY (Hz) | POWER CONSUMPTION (W) |
| GATE DRIVER | $3 \times f1$ | $3 \times C1(V1)^2 f1$ | 0 | 0 |
| FIRST EMISSION DRIVER | $3 \times f2$ | $3 \times C2(V2)^2 f2$ | 0 | ONLY DIRECT-CURRENT COMPONENT |
| SECOND EMISSION DRIVER | $3 \times f3$ | $3 \times C3(V3)^2 f3$ | 0 | 0 |
| THIRD EMISSION DRIVER | $3 \times f4$ | $3 \times C4(V4)^2 f4$ | 0 | 0 |
| SOURCE DRIVER | $3 \times f5$ | $3 \times C5(V5)^2 f5$ | 0 | 0 |

Fig.23
TIME-DIVISION DRIVING MODE
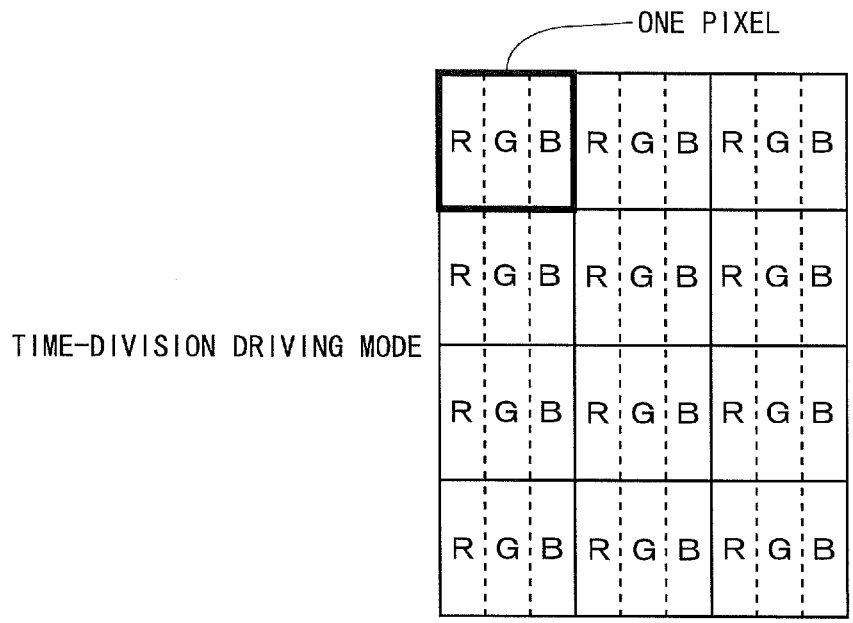
PAUSE DRIVING MODE
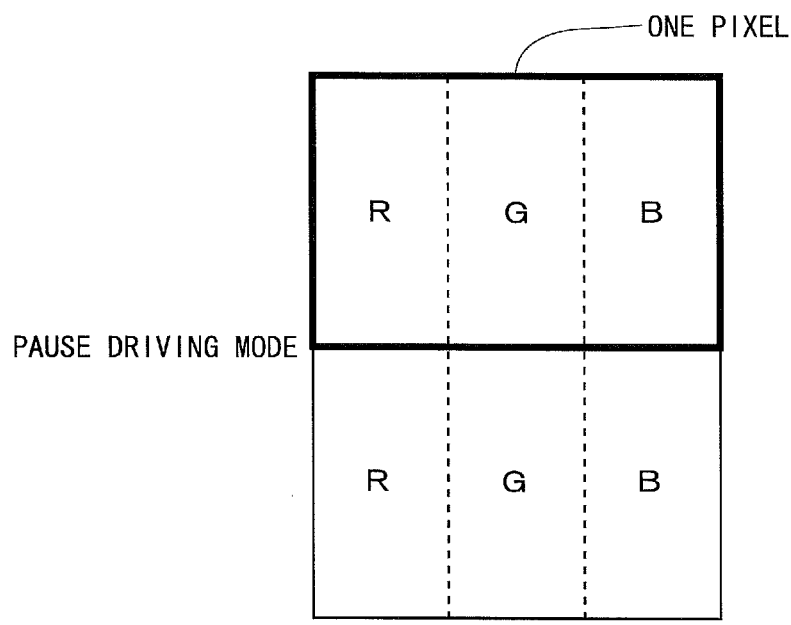

Fig.38 Prior Art

| | FIRST SUBFRAME | | SECOND SUBFRAME | | THIRD SUBFRAME |
|---|---|---|---|---|---|
| | FLYBACK PERIOD | LIGHT EMISSION PERIOD | FLYBACK PERIOD | LIGHT EMISSION PERIOD | FLYBACK PERIOD | LIGHT EMISSION PERIOD |
| LIGHTING STATE | ALL LIGHT OFF | R LIGHT EMISSION | ALL LIGHT OFF | G LIGHT EMISSION | ALL LIGHT OFF | B LIGHT EMISSION |
| DRIVE CURRENT | OFF | ON | OFF | ON | OFF | ON |
| ELVDD | ON | ON | ON | ON | ON | ON |
| ELVSS | ON | ON | ON | ON | ON | ON |
| SOURCE DRIVER | OFF | ON | OFF | ON | OFF | ON |
| GATE DRIVER (SCANNING OPERATION) | OFF | ON | OFF | ON | OFF | ON |
| EMISSION DRIVER (SCANNING OPERATION) | OFF | ON | OFF | ON | OFF | ON |
| EM1 | NON-SELECTED STATE | SELECTED STATE | NON-SELECTED STATE | NON-SELECTED STATE | NON-SELECTED STATE | NON-SELECTED STATE |
| EM2 | NON-SELECTED STATE | NON-SELECTED STATE | NON-SELECTED STATE | SELECTED STATE | NON-SELECTED STATE | NON-SELECTED STATE |
| EM3 | NON-SELECTED STATE | NON-SELECTED STATE | NON-SELECTED STATE | NON-SELECTED STATE | NON-SELECTED STATE | SELECTED STATE |

ONE FRAME PERIOD

Fig.39
Prior Art

| DRIVERS | GENERAL DRIVING | | | | TIME-DIVISION DRIVING | |
|---|---|---|---|---|---|---|
| | FREQUENCY (Hz) | VOLTAGE AMPLITUDE (V) | PARASITIC CAPACITANCE (F) | POWER (W) | FREQUENCY (Hz) | POWER (W) |
| GATE DRIVER | f1 | V1 | C1 | $C_1(V_1)^2 f_1$ | $3 \times f_1$ | $3 \times C_1(V_1)^2 f_1$ |
| FIRST EMISSION DRIVER | f2 | V2 | C2 | $C_2(V_2)^2 f_2$ | $3 \times f_2$ | $3 \times C_2(V_2)^2 f_2$ |
| SECOND EMISSION DRIVER | f3 | V3 | C3 | $C_3(V_3)^2 f_3$ | $3 \times f_3$ | $3 \times C_3(V_3)^2 f_3$ |
| THIRD EMISSION DRIVER | f4 | V4 | C4 | $C_4(V_4)^2 f_4$ | $3 \times f_4$ | $3 \times C_4(V_4)^2 f_4$ |
| SOURCE DRIVER | f5 | V5 | C5 | $C_5(V_5)^2 f_5$ | $3 \times f_5$ | $3 \times C_5(V_5)^2 f_5$ |

DISPLAY DEVICE AND METHOD FOR DRIVING DISPLAY DEVICE

TECHNICAL FIELD

The present invention relates to a display device and more particularly to a display device including self light-emitting type display elements which are driven by a current, such as an organic EL display device, and a method for driving the display device.

BACKGROUND ART

Conventionally, as display elements included in a display device, there are an electro-optical element whose luminance is controlled by a voltage applied thereto, and an electro-optical element whose luminance is controlled by a current flowing therethrough. A representative example of the electro-optical element whose luminance is controlled by a voltage applied thereto includes a liquid crystal display element. On the other hand, a representative example of the electro-optical element whose luminance is controlled by a current flowing therethrough includes an organic EL (Electro Luminescence) element. The organic EL element is also called an OLED (Organic Light-Emitting Diode). An organic EL display device using organic EL elements which are self light-emitting type electro-optical elements can easily achieve slimming down, a reduction in power consumption, an increase in luminance, etc., compared to a liquid crystal display device that requires a backlight, color filters, and the like. Therefore, in recent years, there has been active development of organic EL display devices.

As the driving system of an organic EL display device, there are known a passive matrix system (also called a simple matrix system) and an active matrix system. An organic EL display device adopting the passive matrix system is simple in structure, but is difficult to achieve size increase and definition improvement. On the other hand, an organic EL display device adopting the active matrix system (hereinafter, referred to as "active matrix-type organic EL display device") can easily achieve size increase and definition improvement, compared to the organic EL display device adopting the passive matrix system.

The active matrix-type organic EL display device has a plurality of pixel circuits formed in a matrix form. Each pixel circuit of the active matrix-type organic EL display device typically includes an input transistor that selects a pixel, and a drive transistor that controls the supply of a current to an organic EL element. Note that in the following the current flowing through the organic EL element from the drive transistor may be referred to as "drive current".

Meanwhile, in a general active matrix-type organic EL display device, one pixel is composed of three subpixels (an R subpixel that displays red, a G subpixel that displays green, and a B subpixel that displays blue). FIG. 33 is a circuit diagram showing a configuration of a conventional general pixel circuit 91 forming one subpixel. The pixel circuit 91 is provided corresponding to each of intersections of a plurality of data lines DL and a plurality of scanning signal lines SL which are disposed in a display unit. As shown in FIG. 33, the pixel circuit 91 includes two transistors T1 and T2, one capacitor Cst, and one organic EL element OLED. The transistor T1 is a drive transistor and the transistor T2 is an input transistor. Note that in the example shown in FIG. 33, the transistors T1 and T2 are n-channel thin-film transistors (TFTs).

The transistor T1 is provided in series with the organic EL element OLED. The transistor T1 is connected at its gate terminal to a drain terminal of the transistor T2, connected at its drain terminal to a power supply line that supplies a high-level power supply voltage ELVDD (hereinafter, referred to as "high-level power supply line" and denoted by the same reference character ELVDD as the high-level power supply voltage), and connected at its source terminal to an anode terminal of the organic EL element OLED. The transistor T2 is provided between the data line DL and the gate terminal of the transistor T1. The transistor T2 is connected at its gate terminal to the scanning signal line SL, connected at its drain terminal to the gate terminal of the transistor T1, and connected at its source terminal to the data line DL. The capacitor Cst is connected at its one end to the gate terminal of the transistor T1 and connected at its other end to the source terminal of the transistor T1. A cathode terminal of the organic EL element OLED is connected to a power supply line that supplies a low-level power supply voltage ELVSS (hereinafter, referred to as "low-level power supply line" and denoted by the same reference character ELVSS as the low-level power supply voltage). A connecting point among the gate terminal of the transistor T1, the one end of the capacitor Cst, and the drain terminal of the transistor T2 is hereinafter referred to as "gate node" for convenience sake. A gate-node potential is denoted by reference character VG. Note that although in general, one of the drain and source that has a higher potential is called a drain, in the description of this specification, one is defined as a drain and the other is defined as a source, and thus, a source potential may be higher than a drain potential in some cases.

FIG. 34 is a timing chart for describing the operation of the pixel circuit 91 shown in FIG. 33. Prior to time t91, the scanning signal line SL is in a non-selected state. Therefore, prior to time t91, the transistor T2 is in an off state, and the gate node potential VG keeps its initial level (e.g., a level determined according to writing performed in the preceding frame). At time t91, the scanning signal line SL goes into a selected state and thus the transistor T2 is turned on. By this, a data voltage Vdata corresponding to the luminance of a pixel (subpixel) formed by the pixel circuit 91 is supplied to the gate node through the data line DL and the transistor T2. Thereafter, during a period until time t92, the gate node potential VG changes according to the data voltage Vdata. At this time, the capacitor Cst is charged to a gate-source voltage Vgs which is the difference between the gate node potential VG and the source potential of the transistor T1. At time t92, the scanning signal line SL goes into a non-selected state. By this, the transistor T2 is turned off, and the gate-source voltage Vgs held in the capacitor Cst is fixed. The transistor T1 supplies a drive current to the organic EL element OLED, according to the gate-source voltage Vgs held in the capacitor Cst. As a result, the organic EL element OLED emits light at a luminance according to the drive current.

Meanwhile, the pixel circuit 91 shown in FIG. 33 is a circuit corresponding to one subpixel. Therefore, a configuration of a pixel circuit 910 corresponding to one pixel including three subpixels is as shown in FIG. 35. As shown in FIG. 35, the pixel circuit 910 forming one pixel is composed of a pixel circuit 91(R) for an R subpixel, a pixel circuit 91(G) for a G subpixel, and a pixel circuit 91(B) for a B subpixel. According to the configuration shown in FIG. 35, since many circuit elements are required within a pixel circuit, it is difficult to achieve definition improvement.

In view of this, Japanese Patent Application Laid-Open No. 2005-148749 discloses, as shown in FIG. 36, a pixel circuit 920 configured to further reduce the numbers of transistors and capacitors that are required for one pixel over the conventional one. The pixel circuit 920 is composed of a driving means 921, a sequential control means 922, and three organic EL elements OLED(R), OLED(G), and OLED (B). The driving means 921 is composed of a drive transistor T11, an input transistor T12, and a capacitor Cst1. The sequential control means 922 is composed of a transistor T13(R) for controlling the light emission of the red-color organic EL element OLED(R), a transistor T13(G) for controlling the light emission of the green-color organic EL element OLED(G), and a transistor T13(B) for controlling the light emission of the blue-color organic EL element OLED(B). In addition, as wiring lines for controlling the on/off of the transistors T13(R), T13(G), and T13(B), emission lines EM1, EM2, and EM3 are provided so as to pass through the pixel circuit 920.

In the above-described configuration, one frame period is divided into three subframes. Specifically, one frame period is divided into a first subframe for performing red light emission, a second subframe for performing green light emission, and a third subframe for performing blue light emission. Then, in the sequential control means 922, only the transistor T13(R) is brought into an on state in the first subframe, only the transistor T13(G) is brought into an on state in the second subframe, and only the transistor T13(B) is brought into an on state in the third subframe. By this, the organic EL element OLED(R), the organic EL element OLED(G), and the organic EL element OLED(B) sequentially emit light over one frame period, displaying a desired color image. As such, the organic EL display device disclosed in Japanese Patent Application Laid-Open No. 2005-148749 performs so-called "time-division driving".

Note that Japanese Patent Application Laid-Open No. 2005-148750 discloses an invention of an organic EL display device that performs time-division driving using a pixel circuit 930 having a configuration shown in FIG. 37.

PRIOR ART DOCUMENTS

Patent Documents

[Patent Document 1] Japanese Patent Application Laid-Open No. 2005-148749
[Patent Document 2] Japanese Patent Application Laid-Open No. 2005-148750

SUMMARY OF THE INVENTION

Problems to be Solved by the Invention

However, when an organic EL display device adopts time-division driving such as that described above, power consumption increases compared to the case of adopting a conventional general driving method which is not time-division driving (here, the general driving method is referred to as "general driving"). This will be described below with reference to FIGS. 38 and 39.

In the time-division driving, a light-emitting period and a flyback period are alternately repeated. The light-emitting period is a period for performing light emission of any one of three colors. During the light-emitting period, in order to allow organic EL elements to emit light at desired luminance, the operation of a source driver (a circuit that drives data lines), a gate driver (a circuit that drives scanning signal lines), and an emission driver (a circuit that drives emission lines) goes into an on state (see FIG. 38). Although the length of the light-emitting period is fairly longer than the length of the flyback period, during each light-emitting period, organic EL elements ranging from those included in the first row to those included in the last row need to sequentially emit light in a period with a length that is substantially one-third of one frame period of the general driving. Hence, in the case of adopting the time-division driving, the driving frequency (driving speed) is about three times higher compared to the case of adopting the general driving. When the parasitic capacitance is C, the voltage amplitude is V, and the driving frequency is f, the power consumption P of a peripheral driver is represented by the following equation (1):

[Expression 1]

$$P = C \times V^2 \times f \quad (1)$$

It can be grasped from the above equation (1) that the power consumption P of the peripheral driver is proportional to the driving frequency f. Therefore, as shown in FIG. 39, the power consumption of each peripheral driver in the case of adopting the time-division driving is three times higher than that of the case of adopting the general driving. Regarding this, for example, even when a still image such as a standby screen of a mobile phone is displayed, since the peripheral drivers need to be operated at high frequencies, power consumption increases. Note that the peripheral drivers in this specification refer to drive circuits which are provided in a peripheral region of the display unit to allow the pixel circuits to operate. In addition, as for FIG. 39, first to third emission drivers are circuits for driving the emission lines EM1 to EM3 in FIG. 36, respectively.

An object of the present invention is therefore to further reduce the power consumption in a display device that has self light-emitting type display elements which are driven by a current and that adopts time-division driving, over the conventional one.

Means for Solving the Problems

A first aspect of the present invention is directed to a display device comprising a display unit that includes pixel circuits arranged in a matrix form so as to form a plurality of rows and a plurality of columns, wherein each of the pixel circuits includes j electro-optical elements of different light-emitting colors (j is an integer greater than or equal to 3), an operating mode is switchable between a time-division driving mode in which image display on the display unit is performed by dividing one frame period into j subframes and performing writing of image data to the pixel circuits on a subframe-by-subframe basis, and bringing, in each of the pixel circuits, electro-optical elements of different light-emitting colors into a light-emitting state on a subframe-by-subframe basis; and a pause driving mode in which still image display on the display unit is performed at a lower refresh rate than that for when in the time-division driving mode, by repeating a refresh period during which writing of image data to the pixel circuits is performed and a pause period during which the writing of image data to the pixel circuits is brought into a pause state, and when the operating mode is the pause driving mode, j pixel circuits are considered one group and electro-optical elements of different light-emitting colors in j pixel circuits included in each group are brought into a light-emitting state, by which a still image with a resolution not more than 1/j of a resolution of an image, that is displayed on the display unit when the operating mode is the time-division driving mode, is displayed on the display unit.

According to a second aspect of the present invention, in the first aspect of the present invention, each of the pixel circuits further includes:
j light-emission control transistors provided to have a one-to-one correspondence with the j electro-optical elements; and
a drive current control unit configured to control a drive current for bringing the j electro-optical elements into a light-emitting state,
the display unit includes j light-emission control lines for each row,
in each of the pixel circuits,
control terminals of the j light-emission control transistors are connected to different light-emission control lines,
first conduction terminals of the j light-emission control transistors are connected to the drive current control unit, and
second conduction terminals of the j light-emission control transistors are connected to corresponding electro-optical elements,
when focusing on j pixel circuits included in each group and j light-emission control lines corresponding to the j pixel circuits, each of the focused j light-emission control lines is connected to control terminals of light-emission control transistors corresponding to electro-optical elements of different light-emitting colors in the focused j pixel circuits,
when the operating mode is the time-division driving mode, for each row, the j light-emission control lines are sequentially brought into a selected state on a subframe-by-subframe basis, and
when the operating mode is the pause driving mode, for each row, only one of the j light-emission control lines is brought into a selected state.

According to a third aspect of the present invention, in the second aspect of the present invention, the display device further comprises:
scanning signal lines disposed in the display unit so as to correspond to the respective rows;
data lines disposed in the display unit so as to correspond to the respective columns;
a first power supply line disposed in the display unit and configured to supply a high-level constant voltage to the pixel circuits;
a second power supply line disposed in the display unit and configured to supply a low-level constant voltage to the pixel circuits;
a scanning signal line drive circuit configured to drive the scanning signal lines;
a data line drive circuit configured to drive the data lines; and
a light-emission control line drive circuit configured to drive the light-emission control lines, wherein
the drive current control unit includes:
a drive transistor provided between the first power supply line and the second power supply line so as to be in series with each of the j light-emission control transistors, and configured to control the drive current;
an input transistor provided between a control terminal of the drive transistor and a corresponding one of the data lines, and configured to electrically connect the control terminal of the drive transistor to the corresponding one of the data lines when a corresponding one of the scanning signal lines is brought into a selected state by the scanning signal line drive circuit; and
a capacitor provided between the control terminal of the drive transistor and one conduction terminal of the drive transistor,
during the refresh period,
the light-emission control line drive circuit brings, for each row, only one of the j light-emission control lines into a selected state,
the scanning signal line drive circuit sequentially brings the scanning signal lines disposed in the display unit into a selected state, and
the data line drive circuit applies data voltages according to a still image to be displayed on the display unit during the pause driving mode, to the data lines, according to each of the scanning signal lines going into a selected state, and
during the pause period,
the light-emission control line drive circuit keeps the light-emission control line brought into the selected state during the refresh period, in the selected state and keeps other light-emission control lines in a non-selected state, and
the scanning signal line drive circuit and the data line drive circuit go into a pause state.

According to a fourth aspect of the present invention, in the second aspect of the present invention, the display device further comprises:
scanning signal lines disposed in the display unit so as to correspond to the respective rows;
data lines disposed in the display unit so as to correspond to the respective columns;
a first power supply line disposed in the display unit and configured to supply a high-level constant voltage to the pixel circuits;
a second power supply line disposed in the display unit and configured to supply a low-level constant voltage to the pixel circuits;
a reference voltage line disposed in the display unit and configured to supply a predetermined reference voltage to the pixel circuits;
a scanning signal line drive circuit configured to drive the scanning signal lines;
a data line drive circuit configured to drive the data lines; and
a light-emission control line drive circuit configured to drive the light-emission control lines, wherein
the drive current control unit includes:
a drive transistor provided between the first power supply line and the second power supply line so as to be in series with each of the j light-emission control transistors, and configured to control the drive current;
a reference voltage supply control transistor provided between a control terminal of the drive transistor and the reference voltage line, and configured to electrically connect the control terminal of the drive transistor to the reference voltage line when a corresponding one of the scanning signal lines is brought into a selected state by the scanning signal line drive circuit;
an input transistor provided between one conduction terminal of the drive transistor and a corresponding one of the data lines, and configured to electrically connect the one conduction terminal of the drive transistor to the corresponding one of the data lines when the corresponding one of the scanning signal lines is brought into a selected state by the scanning signal line drive circuit; and a capacitor provided between the control terminal of the drive transistor and the one conduction terminal of the drive transistor, during the refresh period, the light-emission control line drive circuit brings, for each row, only one of the j light-emission control lines into a selected state, the scanning signal line drive circuit sequentially brings the scanning signal lines disposed in the display unit into a selected state, and the data line drive circuit applies data voltages according to a still image to be displayed on the display unit during the pause driving mode, to the data lines, according to each of the scanning signal lines going into a selected state, and during the pause period, the light-emission control line drive circuit keeps the light-emission control line brought into the selected state during the refresh period, in the selected state and keeps other light-emission control lines in a non-selected state, and the scanning signal line drive circuit and the data line drive circuit go into a pause state.

According to a fifth aspect of the present invention, in the third or fourth aspect of the present invention, the drive transistor, the input transistor, and the j light-emission control transistors are thin-film transistors whose channel layers are formed of an oxide semiconductor.

According to a sixth aspect of the present invention, in the fifth aspect of the present invention, main components of the oxide semiconductor are indium (In), gallium (Ga), zinc (Zn), and oxygen (O).

According to a seventh aspect of the present invention, in the first aspect of the present invention, a black display period during which the j electro-optical elements included in each of the pixel circuits are brought into a light-off state and image data corresponding to a black color is written to the pixel circuits is provided before the refresh period.

According to an eighth aspect of the present invention, in the first aspect of the present invention, when the operating mode is the pause driving mode, one pixel is formed by j pixel circuits included in one group, and a still image with a resolution equal to 1/j of a resolution of an image displayed on the display unit when the operating mode is the time-division driving mode is displayed on the display unit.

According to a ninth aspect of the present invention, in the first aspect of the present invention, when the operating mode is the pause driving mode, one pixel is formed by k×j pixel circuits included in k groups corresponding to k consecutive rows (k is an integer greater than or equal to 2), and a still image with a resolution equal to 1/(k×j) of a resolution of an image displayed on the display unit when the operating mode is the time-division driving mode is displayed on the display unit.

According to a tenth aspect of the present invention, in the ninth aspect of the present invention, a value of the k is determined such that a shape of each pixel for when the operating mode is the pause driving mode becomes a square.

According to an eleventh aspect of the present invention, in the second aspect of the present invention, when focusing on j light-emission control lines corresponding to each row, a light-emission control line brought into a selected state when the operating mode is the pause driving mode is changed as appropriate.

According to a twelfth aspect of the present invention, in the eleventh aspect of the present invention, the light-emission control line brought into a selected state when the operating mode is the pause driving mode is changed every time the operating mode is switched from the time-division driving mode to the pause driving mode.

According to a thirteenth aspect of the present invention, in the first aspect of the present invention, the j electro-optical elements included in each of the pixel circuits are three organic electroluminescence elements having a red light-emitting color, a green light-emitting color, and a blue light-emitting color.

According to a fourteenth aspect of the present invention, in the first aspect of the present invention, the j electro-optical elements included in each of the pixel circuits are four organic electroluminescence elements having a red light-emitting color, a green light-emitting color, a blue light-emitting color, and a white light-emitting color.

A fifteenth aspect of the present invention is directed to a driving method for a display device including a display unit in which pixel circuits are arranged in a matrix form so as to form a plurality of rows and a plurality of columns, each of the pixel circuits including j electro-optical elements of different light-emitting colors (j is an integer greater than or equal to 3), the method comprising:

a time-division driving step of performing image display on the display unit by dividing one frame period into j subframes and performing writing of image data to the pixel circuits on a subframe-by-subframe basis, and bringing, in each of the pixel circuits, electro-optical elements of different light-emitting colors into a light-emitting state on a subframe-by-subframe basis; and a pause driving step of performing still image display on the display unit at a lower refresh rate than that for when in the time-division driving step, by repeating a refresh period during which writing of image data to the pixel circuits is performed and a pause period during which the writing of image data to the pixel circuits is brought into a pause state, wherein in the pause driving step, j pixel circuits are considered one group and electro-optical elements of different light-emitting colors in j pixel circuits included in each group are brought into a light-emitting state, by which a still image with a resolution not more than 1/j of a resolution of an image displayed on the display unit in the time-division driving step is displayed on the display unit.

Effects of the Invention

According to the first aspect of the present invention, j pixel circuits are considered one group, and electro-optical elements of different light-emitting colors can be brought into a light-emitting state in j pixel circuits included in each group. Hence, a still image with a resolution not more than 1/j of a resolution of a normal image can be displayed by one vertical scanning. By this, in a display device that performs time-division driving, pause driving can be adopted, and power consumption is further reduced over the conventional one.

According to the second aspect of the present invention, only by selecting one of j light-emission control lines corresponding to each row, electro-optical elements of different light-emitting colors can be brought into a light-emitting state in j pixel circuits included in each group. Hence, the power consumption resulting from driving of the light-emission control lines during the pause driving mode becomes very small.

According to the third aspect of the present invention, in a display device in which a drive current control unit that controls a drive current for bringing the electro-optical elements into a light-emitting state is composed of a drive transistor, an input transistor, and a capacitor, the scanning signal line drive circuit and the data line drive circuit go into a pause state and the light-emission control line drive circuit consumes only direct-current power during a pause period. By this, regarding the display device that performs time-division driving, power consumption can be certainly further reduced over the conventional one.

According to the fourth aspect of the present invention, in a display device in which a drive current control unit that controls a drive current for bringing the electro-optical elements into a light-emitting state is composed of a drive transistor, an input transistor, a reference voltage supply control transistor, and a capacitor, the scanning signal line drive circuit and the data line drive circuit go into a pause state and the light-emission control line drive circuit consumes only direct-current power during a pause period. By this, regarding the display device that performs time-division driving, power consumption can be certainly further reduced over the conventional one.

According to the fifth aspect of the present invention, the off-leakage current in the transistors in the pixel circuits becomes very small. Hence, voltages according to a display image can be held in the capacitors in the pixel circuits for a longer period of time than the conventional one. Accordingly, by increasing the length of a pause period upon the pause driving mode to reduce the refresh rate, power consumption can be significantly reduced over the conventional one.

According to the sixth aspect of the present invention, by using indium gallium zinc oxide as an oxide semiconductor which forms a channel layer, the effect of the fifth aspect of the present invention can be certainly attained.

According to the seventh aspect of the present invention, writing of data corresponding to black display is performed before performing writing to display a still image during the pause driving mode. Hence, the electro-optical elements are prevented from emitting light at luminance determined according to the last writing. By this, the display quality of a still image displayed during the pause driving mode is increased.

According to the eighth aspect of the present invention, while a reduction in resolution for when the operating mode is switched from the time-division driving mode to the pause driving mode is minimized, the same effect as that of the first aspect of the present invention can be obtained.

According to the ninth aspect of the present invention, during a refresh period, the same data may be written on k consecutive rows for each column. Hence, the power consumption resulting from writing of image data during a refresh period is reduced.

According to the tenth aspect of the present invention, a more natural still image is displayed on the display unit during the pause driving mode.

According to the eleventh aspect of the present invention, the occurrence of bias in the levels of degradation of transistors and degradation of electro-optical elements in each pixel circuit is prevented.

According to the twelfth aspect of the present invention, as with the eleventh aspect of the present invention, the occurrence of bias in the levels of degradation of transistors and degradation of electro-optical elements in each pixel circuit is prevented.

According to the thirteenth aspect of the present invention, in a display device using, as the electro-optical elements, three organic electroluminescence elements having a red light-emitting color, a green light-emitting color, and a blue light-emitting color, the same effect as that of the first aspect of the present invention can be obtained.

According to the fourteenth aspect of the present invention, in a display device using, as the electro-optical elements, four organic electroluminescence elements having a red light-emitting color, a green light-emitting color, a blue light-emitting color, and a white light-emitting color, the same effect as that of the first aspect of the present invention can be obtained.

According to the fifteenth aspect of the present invention, in a driving method for a display device, the same effect as that of the first aspect of the present invention can be obtained.

BRIEF DESCRIPTION OF THE DRAWINGS

FIG. 12 is a diagram showing light-emitting states for a first subframe for when the operating mode is the time-division driving mode in the embodiment.

FIG. 13 is a diagram showing light-emitting states for a second subframe for when the operating mode is the time-division driving mode in the embodiment.

FIG. 14 is a diagram showing light-emitting states for a third subframe for when the operating mode is the time-division driving mode in the embodiment.

FIG. 19 is a diagram for describing an effect in the embodiment.

FIG. 20 is a diagram for describing the effect in the embodiment.

FIG. 21 is a diagram for describing the effect in the embodiment.

FIG. 23 is a diagram for describing the case of forming one pixel by six pixel circuits included in two consecutive rows in an extension direction of data lines in the first variant of the embodiment.

FIG. 38 is a diagram for describing time-division driving in a conventional organic EL display device.

FIG. 39 is a diagram for describing differences in the power consumption of peripheral drivers between when general driving is adopted and when the time-division driving is adopted in a conventional example.

MODE FOR CARRYING OUT THE INVENTION

An embodiment of the present invention will be described below with reference to the accompanying drawings. Note that in the following it is assumed that m and n are integers greater than or equal to 2. Note also that, as for each transistor, the gate terminal corresponds to a control terminal, the drain terminal corresponds to a first conduction terminal, and the source terminal corresponds to a second conduction terminal.

<1. Overall Configuration and Summary of Operation>

Figure 2:
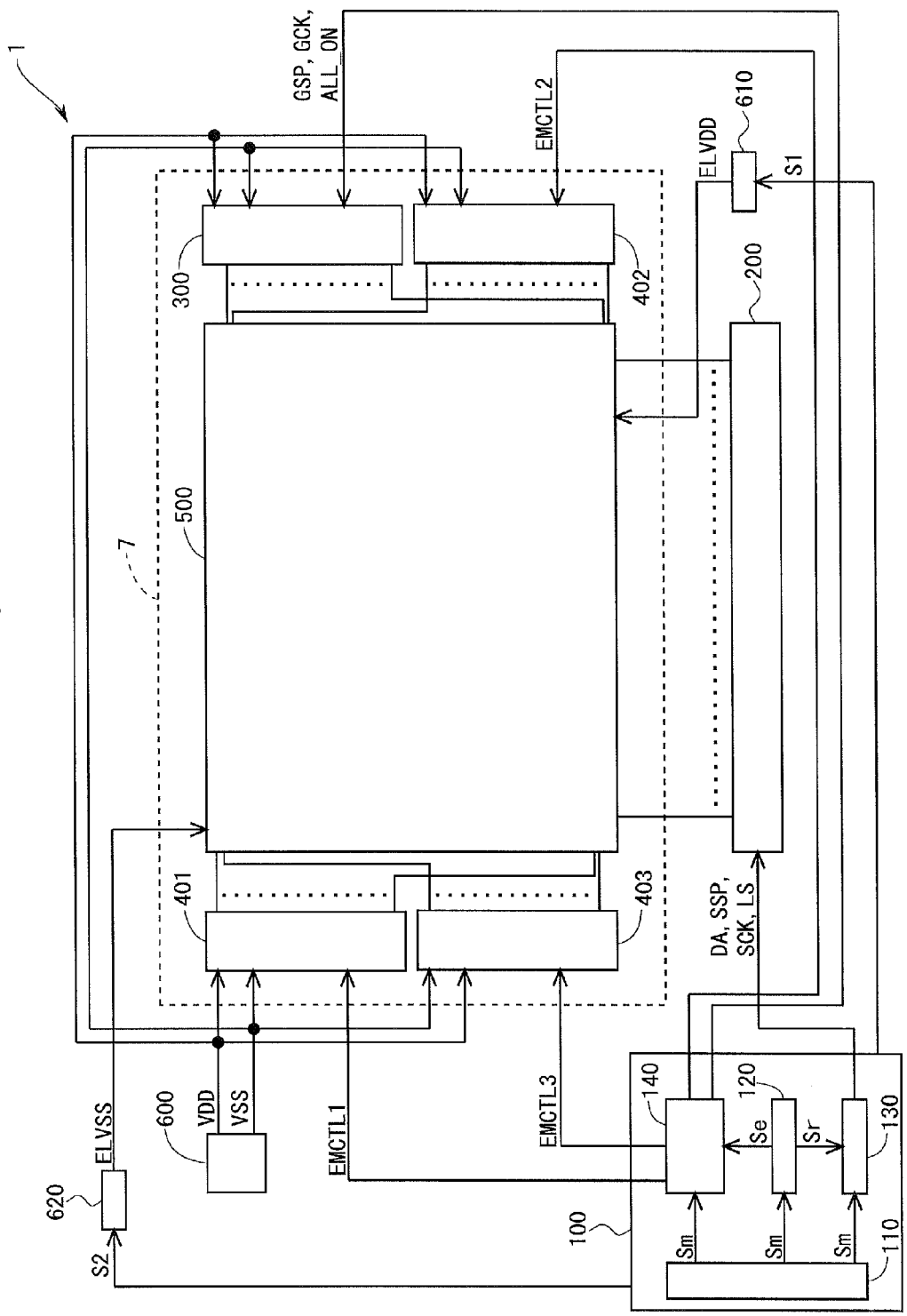
FIG. 2 is a block diagram showing an overall configuration of the organic EL display device in the embodiment.

FIG. 2 is a block diagram showing an overall configuration of an active matrix-type organic EL display device 1 according to an embodiment of the present invention. The organic EL display device 1 includes a display control circuit 100, a source driver (a data line drive circuit) 200, a gate driver (a scanning signal line drive circuit) 300, first to third emission drivers (first to third light-emission control line drive circuits) 401 to 403, and a display unit 500. The first to third emission drivers 401 to 403 are hereinafter also collectively and simply referred to as "emission driver". The emission driver is a drive circuit for wiring lines (emission lines which will be described later) for controlling the light emission of organic EL elements provided in the display unit 500. Note that in the present embodiment the gate driver 300 and the first to third emission drivers 401 to 403 are formed in an organic EL panel 7 including the display unit 500. That is, the gate driver 300 and the emission driver are monolithic. In addition, the organic EL display device 1 is provided with a logic power supply 600, an organic EL high-level power supply 610, and an organic EL low-level power supply 620, as components for supplying various types of power supply voltages to the organic EL panel 7.

Meanwhile, at normal times, the organic EL display device 1 in the present embodiment performs time-division driving that divides one frame period into three subframes. In addition, when there is no change in image content throughout a period greater than or equal to a given period during the time-division driving, pause driving that provides a period (pause period) during which the operation of the peripheral drivers pauses is performed. Specifically, the organic EL display device 1 switches the operating mode between a time-division driving mode and a pause driving mode.

A high-level power supply voltage VDD and a low-level power supply voltage VSS which are required for the operation of the gate driver 300 and the first to third emission drivers 401 to 403 are supplied to the organic EL panel 7 from the logic power supply 600. A high-level power supply voltage ELVDD which is a constant voltage is supplied to the organic EL panel 7 from the organic EL high-level power supply 610. A low-level power supply voltage ELVSS which is a constant voltage is supplied to the organic EL panel 7 from the organic EL low-level power supply 620.

Figure 3:
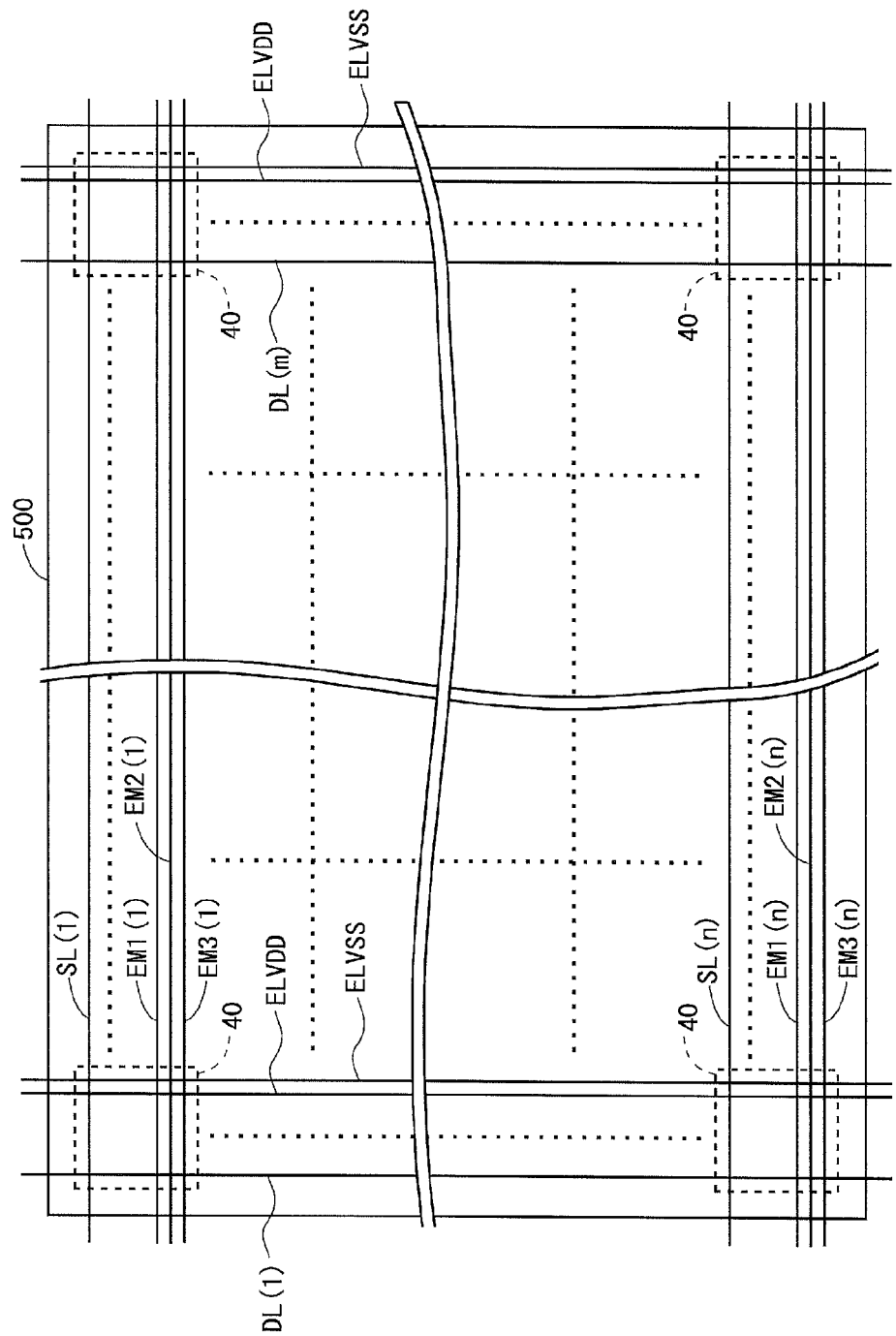
FIG. 3 is a diagram for describing a configuration of a display unit in the embodiment.

FIG. 3 is a diagram for describing a configuration of the display unit 500 in the present embodiment. In the display unit 500, as shown in FIG. 3, m data lines DL(1) to DL(m) and n scanning signal lines SL(1) to SL(n) are disposed so as to intersect with each other. Pixel circuits 40 are provided at the respective intersections of the data lines DL(1) to DL(m) and the scanning signal lines SL(1) to SL(n). That is, in the display unit 500, the pixel circuits 40 are arranged in a matrix form so as to form a plurality of rows (n rows) and a plurality of columns (m columns). In addition, in the display unit 500, n first emission lines EM1(1) to EM1(n), n second emission lines EM2(1) to EM2(n), and n third emission lines EM3(1) to EM3(n) are disposed so as to correspond to the n scanning signal lines SL(1) to SL(n). Furthermore, in the display unit 500, high-level power supply lines ELVDD and low-level power supply lines ELVSS are disposed. In the present embodiment, the first power supply line is implemented by the high-level power supply lines ELVDD, and the second power supply line is implemented by the low-level power supply lines ELVSS. A detailed configuration of the pixel circuits 40 will be described later.

Note that in the following, when the m data lines DL(1) to DL(m) do not need to be distinguished from each other, the data lines are simply represented by reference character DL. Likewise, the scanning signal lines, the first emission lines, the second emission lines, and the third emission lines are simply represented by reference characters SL, EM1, EM2, and EM3, respectively. In addition, the first to third emission lines EM1 to EM3 are also collectively and simply referred to as "emission line", and the emission line is denoted by reference character EM. In the present embodiment, the light-emission control lines are implemented by the emission lines EM.

As shown in FIG. 2, the display control circuit 100 includes an operating mode switching control circuit 110, a resolution switching control circuit 120, a source control circuit 130, and a gate control circuit 140. The operating mode switching control circuit 110 provides an operating mode switching signal Sm for switching the operating mode of the organic EL display device 1 between the time-division driving mode and the pause driving mode, to the resolution switching control circuit 120, the source control circuit 130, and the gate control circuit 140. The resolution switching control circuit 120 provides a resolution switching signal Sr for switching the resolution of a display image between the time-division driving mode and the pause driving mode, to the source control circuit 130 and provides an emission line enable signal Se for controlling whether to select each emission line EM, to the gate control circuit 140. The source control circuit 130 outputs display data DA, a source start pulse signal SSP, a source clock signal SCK, and a latch strobe signal LS which are for controlling the operation of the source driver 200, based on the operating mode switching signal Sm and the resolution switching signal Sr. The gate control circuit 140 outputs a gate start pulse signal GSP, a gate clock signal GCK, and an all-on signal ALL_ON which are for controlling the operation of the gate driver 300, based on the operating mode switching signal Sm. The gate control circuit 140 also outputs first to third emission driver control signals EMCTL1 to EMCTL3 for controlling the operation of the first to third emission drivers 401 to 403, based on the operating mode switching signal Sm and the emission line enable signal Se. In addition, a control signal S1 and a control signal S2 for controlling the on/off of the power supplies are provided to the organic EL high-level power supply 610 and the organic EL low-level power supply 620, respectively, from the display control circuit 100.

The source driver 200 receives the display data DA, the source start pulse signal SSP, the source clock signal SCK, and the latch strobe signal LS which are transmitted from the display control circuit 100, and applies driving video signals to the data lines DL(1) to DL(m).

Figure 4:
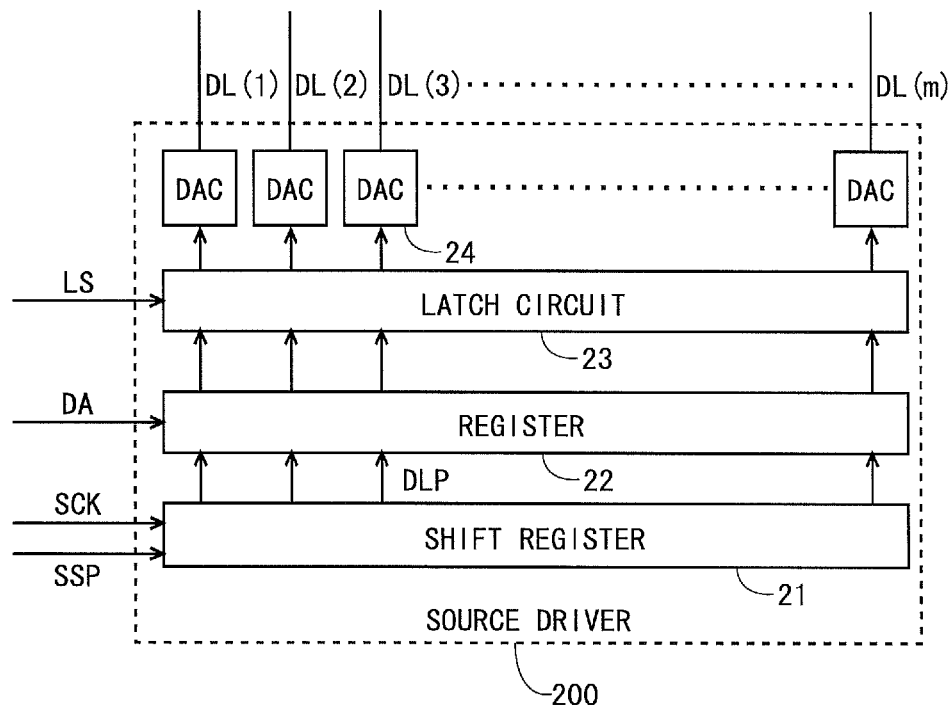
FIG. 4 is a block diagram showing a configuration of a source driver in the embodiment.

FIG. 4 is a block diagram showing a configuration of the source driver 200. The source driver 200 includes an m-bit shift register 21, a register 22, a latch circuit 23, and m D/A converters (DAC) 24. The shift register 21 has m cascade-connected registers (not shown). The shift register 21 sequentially transfers a pulse of the source start pulse signal SSP to be supplied to a first-stage register, from an input terminal to an output terminal, based on the source clock signal SCK. According to the pulse transfer, timing pulses DLP corresponding to the respective data lines DL are output from the shift register 21. Based on the timing pulses DLP, the register 22 stores the display data DA. The latch circuit 23 catches and holds the display data DA for one row which is stored in the register 22, according to the latch strobe signal LS. The D/A converters 24 are provided for the respective data lines DL. The D/A converters 24 convert the display data DA held in the latch circuit 23 into analog voltages. The converted analog voltages are applied as driving video signals to all of the data lines DL(1) to DL(m) at the same time.

The gate driver 300 sequentially applies an active scanning signal to the n scanning signal lines SL(1) to SL(n), based on the gate start pulse signal GSP and the gate clock signal GCK which are transmitted from the display control circuit 100. The gate driver 300 also applies active scanning signals to the n scanning signal lines SL(1) to SL(n) at the same time, based on the all-on signal ALL_ON which is transmitted from the display control circuit 100. Note that, regarding the scanning signal line SL, the state in which an active scanning signal is being applied is referred to as "selected state". The same also applies to the emission line EM. When a scanning signal line SL is in the selected state, writing of data is performed in the pixel circuits 40 corresponding to the scanning signal line SL. Note that in this specification the writing of data corresponding to black display, separately from original video data, to the pixel circuits is referred to as "black insertion".

Figure 5:
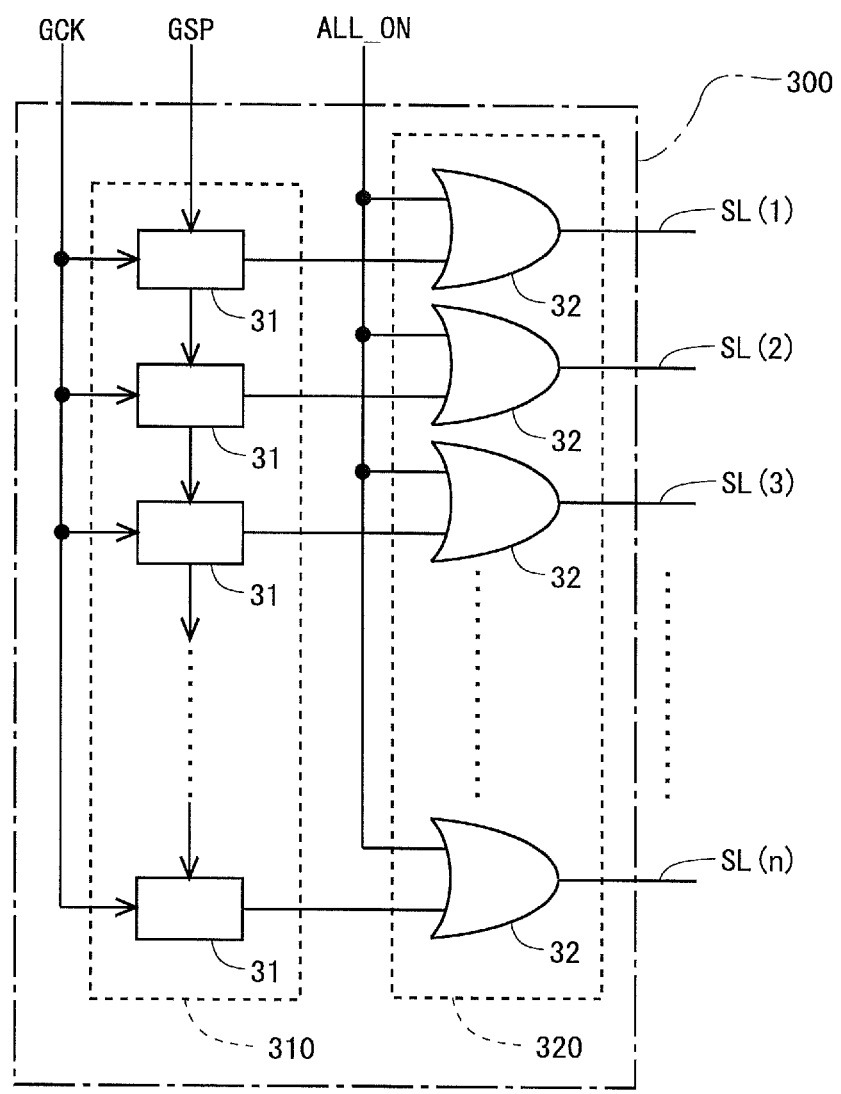
FIG. 5 is a block diagram showing a configuration of a gate driver in the embodiment.

FIG. 5 is a block diagram showing a configuration of the gate driver 300 in the present embodiment. The gate driver 300 is composed of a shift register 310 including n flip-flop circuits 31; and a black insertion control unit 320 for performing control of black insertion. The shift register 310 is configured such that the gate start pulse signal GSP is provided to a first-stage flip-flop circuit 31, and the gate clock signal GCK is provided to all of the flip-flop circuits 31 in a shared manner. The black insertion control unit 320 is provided with n OR circuits 32 such that the OR circuits 32 have a one-to-one correspondence with the flip-flop circuits 31 in the shift register 310. To each of the OR circuits 32, an output signal from a flip-flop circuit 31 and the all-on signal ALL_ON are inputted. In addition, output signals from the OR circuits 32 are provided as scanning signals to the scanning signal lines SL.

Figure 6:
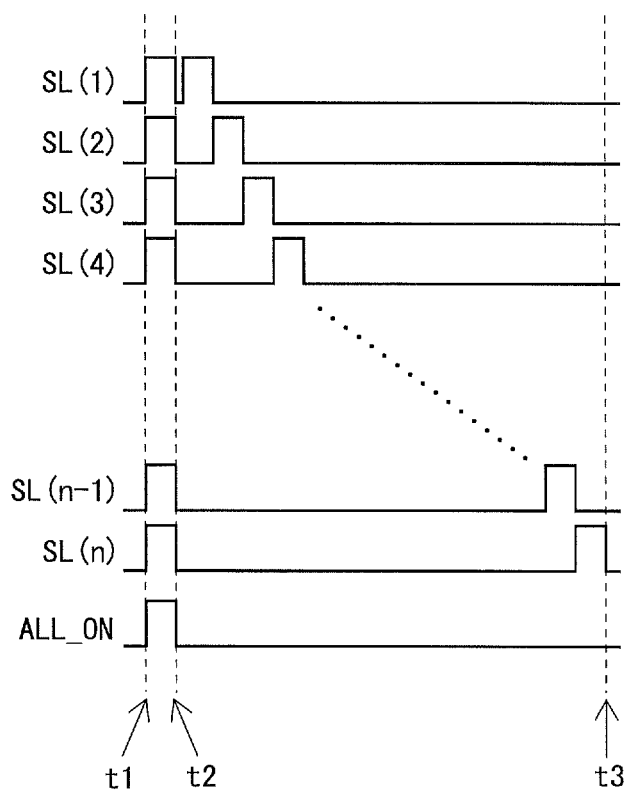
FIG. 6 is a timing chart for describing an operation of the gate driver in the embodiment.

In the above-described configuration, when the all-on signal ALL_ON is at a high level, a high-level signal is provided to all of the OR circuits 32. By this, as in the period of time point t1 to t2 in FIG. 6, the n scanning signal lines SL(1) to SL(n) go into the selected state at the same time. When a pulse of the gate start pulse signal GSP is provided to the first-stage flip-flop circuit 31 of the shift register 310 when the all-on signal ALL_ON is at a low level, the pulse included in the gate start pulse signal GSP is sequentially transferred from the first-stage flip-flop circuit 31 to an nth-stage flip-flop circuit 31, based on the gate clock signal GCK. Then, according to the pulse transfer, output signals from the first- to nth-stage flip-flop circuits 31 sequentially go to a high level. By this, as in the period of time point t2 to t3 in FIG. 6, the n scanning signal lines SL(1) to SL(n) sequentially go into the selected state for a predetermined period.

As described above, in the present embodiment, the gate driver 300 is configured so as to allow both bringing of the n scanning signal lines SL(1) to SL(n) into the selected state at the same time and bringing of the n scanning signal lines SL(1) to SL(n) into the selected state sequentially for a predetermined period.

The first emission driver 401 applies first light-emission control signals to the n first emission lines EM1(1) to EM1(*n*), based on the first emission driver control signal EMCTL1 which is transmitted from the display control circuit 100. Note that the first emission driver control signal EMCTL1 includes an emission start pulse signal ESP, an emission clock signal ECK, an all-on signal ALL_ON, and an all-off signal ALL_OFF.

Figure 7:
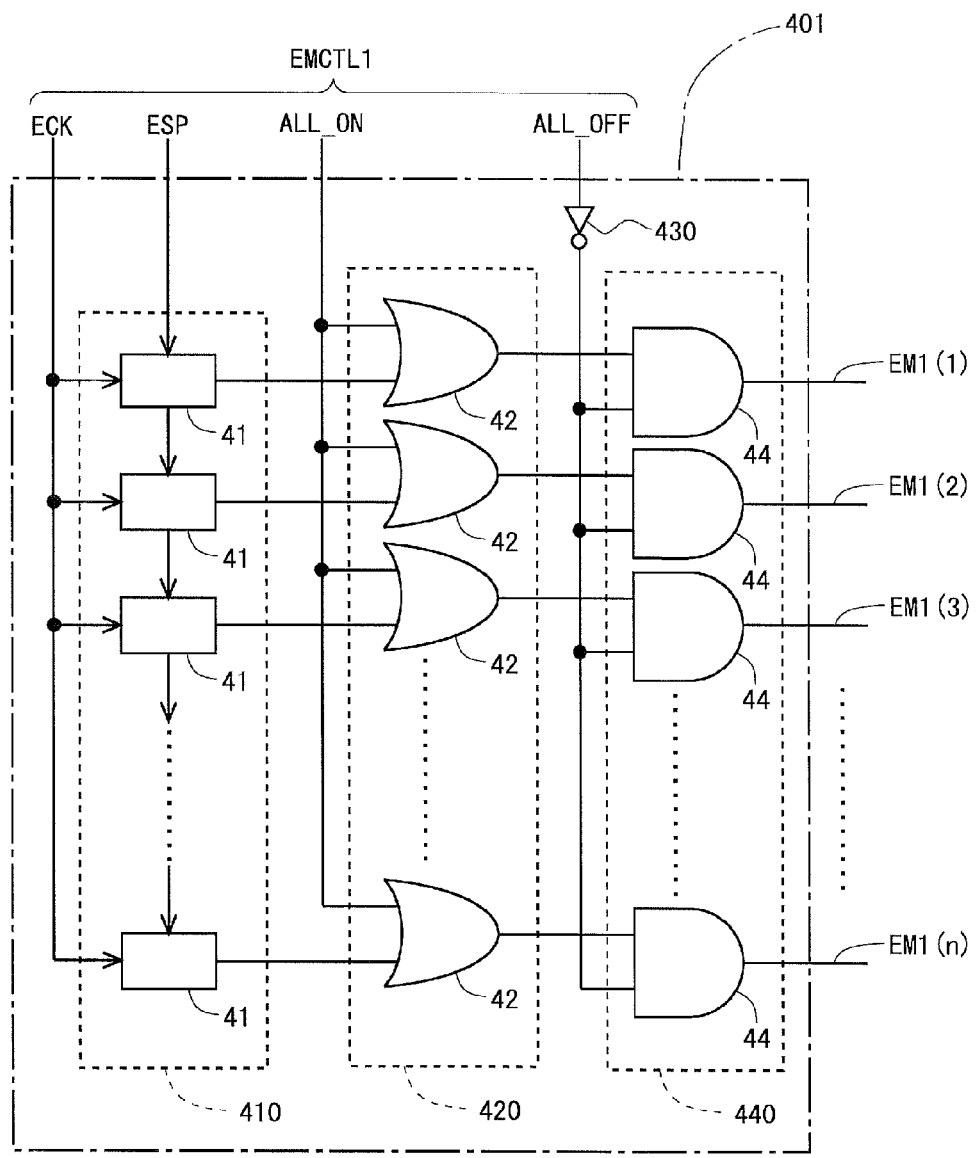
FIG. 7 is a block diagram showing a configuration of a first emission driver in the embodiment.

FIG. 7 is a block diagram showing a configuration of the first emission driver 401 in the present embodiment. The first emission driver 401 is composed of a shift register 410 including n flip-flop circuits 41; an all-on control unit 420 for bringing all of the first emission lines EM1(1) to EM1(*n*) into the selected state; an inverter 430; and an all-off control unit 440 for bringing all of the first emission lines EM1(1) to EM1(*n*) into the non-selected state. The shift register 410 and the all-on control unit 420 in the first emission driver 401 have the same configurations as the shift register 310 and the black insertion control unit 320 in the gate driver 300, respectively. The inverter 430 inverts the logic level of the all-off signal ALL_OFF. The all-off control unit 440 is provided with n AND circuits 44 such that the AND circuits 44 have a one-to-one correspondence with OR circuits 42 in the all-on control unit 420. To each of the AND circuits 44, an output signal from the inverter 430 (logic inverted signal of the all-off signal ALL_OFF) and an output signal from an OR circuits 42 are inputted. In addition, output signals from the AND circuits 44 are provided as first light-emission control signals to the first emission lines EM1.

In the above-described configuration, when the all-off signal ALL_OFF is at a high level, a low-level signal which is output from the inverter 430 is provided to all of the AND circuits 44. By this, all of the first emission lines EM1(1) to EM1(*n*) go into the non-selected state. When the all-on signal ALL_ON is brought to a high level when the all-off signal ALL_OFF is at a low level, a high-level signal is provided to both of two input terminals of the AND circuits 44. By this, all of the first emission lines EM1(1) to EM1(*n*) go into the selected state. When both of the all-off signal ALL_OFF and the all-on signal ALL_ON are at a low level, the n first emission lines EM1(1) to EM1(*n*) sequentially go into the selected state, based on the emission start pulse signal ESP and the gate clock signal GCK.

Note that the configurations and the operations of the second emission driver 402 and the third emission driver 403 are the same as those of the first emission driver 401 and thus a description thereof is omitted.

In the above-described manner, driving video signals are applied to the m data lines DL(1) to DL(m), scanning signals are applied to the n scanning signal lines SL(1) to SL(n), first light-emission control signals are applied to the n first emission lines EM1(1) to EM1(*n*), second light-emission control signals are applied to the n second emission lines EM2(1) to EM2(*n*), and third light-emission control signals are applied to the n third emission lines EM3(1) to EM3(*n*), by which image display on the display unit 500 is performed. Note that in the following the first to third light-emission control signals are also collectively and simply referred to as "light-emission control signal".

<2. Configuration of the Pixel Circuit>

Figure 8:
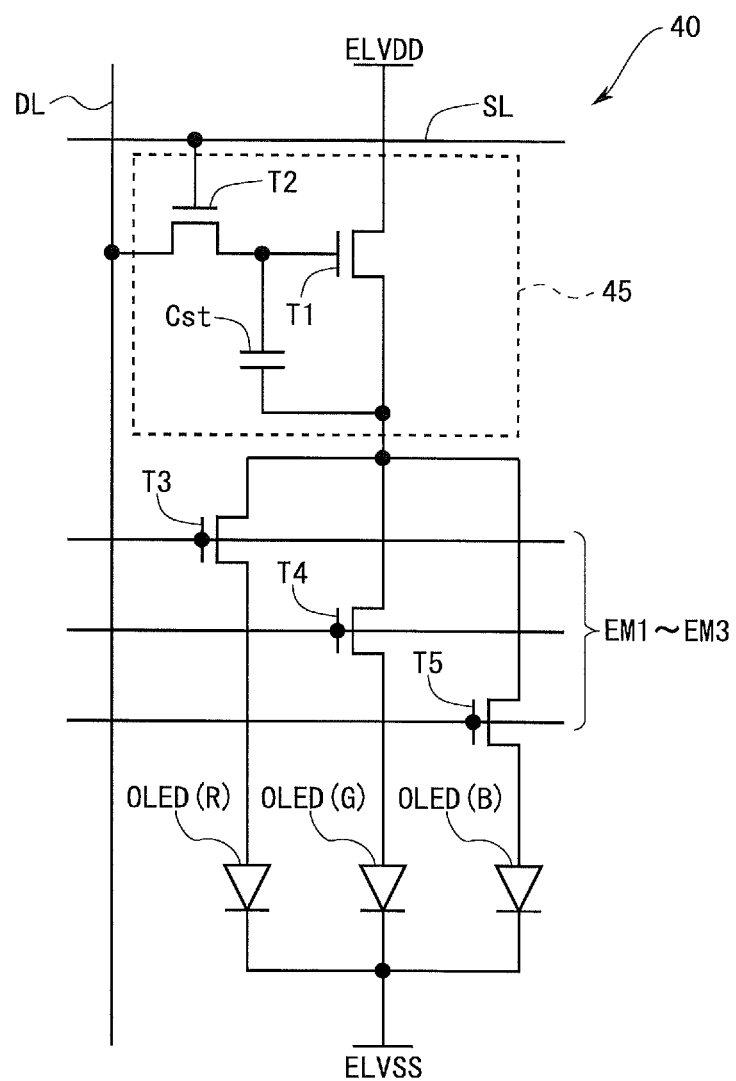
FIG. 8 is a circuit diagram showing a configuration of a pixel circuit in the embodiment.

FIG. 8 is a circuit diagram showing a configuration of a pixel circuit 40 in the present embodiment. The pixel circuit 40 shown in FIG. 8 forms one pixel at normal times. The pixel circuit 40 is provided corresponding to each of intersections of the m data lines DL(1) to DL(m) and the n scanning signal lines SL(1) to SL(n) which are disposed in the display unit 500. As shown in FIG. 8, the pixel circuit 40 includes five transistors T1 to T5, one capacitor Cst, and three organic EL elements OLED(R), OLED(G), and OLED (B). The transistor T1 is a drive transistor and the transistor T2 is an input transistor. The transistors T3, T4, and T5 function as light-emission control transistors that perform light emission control by controlling the supply of a drive current to the organic EL elements OLED(R), OLED(G), and OLED(B), respectively. The organic EL element OLED (R) functions as an electro-optical element that emits red light. The organic EL element OLED(G) functions as an electro-optical element that emits green light. The organic EL element OLED(B) functions as an electro-optical element that emits blue light. In the following, the three organic EL elements OLED(R), OLED(G), and OLED(B) are also collectively and simply referred to as "organic EL element OLED".

Note that in the present embodiment the drive current control unit 45 that controls a drive current for bringing the organic EL elements OLED into a light-emitting state is implemented by the transistor T1, the transistor T2, and the capacitor Cst.

As shown in FIG. 8, the transistor T1 is provided in series with each of the transistors T3 to T5 and in series with each of the organic EL elements OLED(R), OLED(G), and OLED(B). In other words, the transistor T1 and the organic EL element OLED(R) are connected in series with each other through the transistor T3, the transistor T1 and the organic EL element OLED(G) are connected in series with each other through the transistor T4, and the transistor T1 and the organic EL element OLED(B) are connected in series with each other through the transistor T5. The transistor T1 is connected at its gate terminal to a drain terminal of the transistor T2, connected at its drain terminal to the high-level power supply line ELVDD, and connected at its source terminal to drain terminals of the transistors T3 to T5. The transistor T2 is provided between the data line DL and the gate terminal of the transistor T1. The transistor T2 is connected at its gate terminal to the scanning signal line SL, connected at its drain terminal to the gate terminal of the transistor T1, and connected at its source terminal to the data line DL. The capacitor Cst is connected at its one end to the gate terminal of the transistor T1 and connected at its other end to the source terminal of the transistor T1. The transistor T3 is connected at its drain terminal to the source terminal of the transistor T1 and connected at its source terminal to an anode terminal of the organic EL element OLED(R). The transistor T4 is connected at its drain terminal to the source terminal of the transistor T1 and connected at its source terminal to an anode terminal of the organic EL element OLED(G). The transistor T5 is connected at its drain terminal to the source terminal of the transistor T1 and connected at its source terminal to an anode terminal of the organic EL element OLED(B). Each of gate terminals of the transistors T3 to T5 is connected to any of the first to third emission lines EM1 to EM3. Note that a specific connection relationship between the first to third emission lines EM1 to EM3 and the gate terminals of the transistors T3 to T5 will be described later. Cathode terminals of the organic EL elements OLED(R), OLED(G), and OLED(B) are connected to the organic EL low-level power supply line ELVSS.

In the present embodiment, three pixel circuits 40 arranged side by side in an extension direction of the scanning signal lines SL are considered one group. Since the number of columns is m, (m/3) groups are formed for each row. Then, when the operating mode is the pause driving mode, one pixel is formed by three pixel circuits 40 included in each group. Note that how one pixel is formed by three pixel circuits 40 will be described later.

Figure 1:
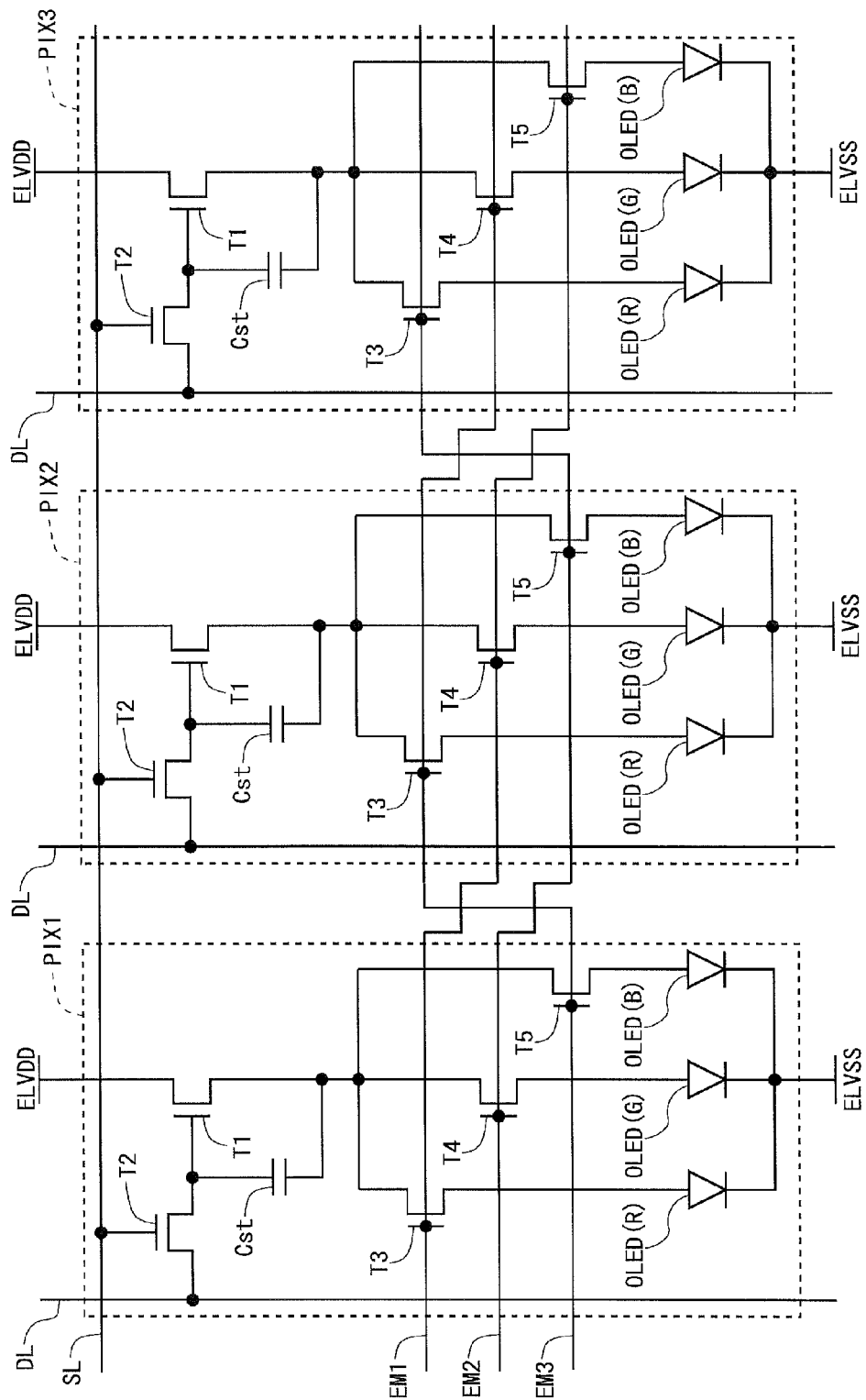
FIG. 1 is a circuit diagram showing a configuration of three pixel circuits included in one group in an active matrix-type organic EL display device according to an embodiment of the present invention.

FIG. 1 is a circuit diagram showing a configuration of three pixel circuits PIX1 to PIX3 included in one group. The configuration of each pixel circuit is as described above (see FIG. 8). Here, a connection relationship between the first to third emission lines EM1 to EM3 and the gate terminals of the transistors T3 to T5 included in the three pixel circuits PIX1 to PIX3 will be described. The first emission line EM1 is connected to the gate terminal of the transistor T3 in the pixel circuit PIX1, the gate terminal of the transistor T4 in the pixel circuit PIX2, and the gate terminal of the transistor T5 in the pixel circuit PIX3. The second emission line EM2 is connected to the gate terminal of the transistor T4 in the pixel circuit PIX1, the gate terminal of the transistor T5 in the pixel circuit PIX2, and the gate terminal of the transistor T3 in the pixel circuit PIX3. The third emission line EM3 is connected to the gate terminal of the transistor T5 in the pixel circuit PIX1, the gate terminal of the transistor T3 in the pixel circuit PIX2, and the gate terminal of the transistor T4 in the pixel circuit PIX3. As such, each of the first to third emission lines EM1 to EM3 is connected to the gate terminals of transistors corresponding to organic EL elements OLED of different light-emitting colors in the three pixel circuits PIX1 to PIX3.

Meanwhile, in the present embodiment, the transistors T1 to T5 in each pixel circuit 40 are n-channel TFTs (thin-film transistors). In addition, in the present embodiment, for the transistors T1 to T5, oxide TFTs (thin-film transistors using an oxide semiconductor for a channel layer) are adopted. Specifically, a TFT whose channel layer is formed of In—Ga—Zn—O (indium gallium zinc oxide) which is an oxide semiconductor having indium (In), gallium (Ga), zinc (Zn), and oxygen (O) as main components (hereinafter, the TFT is referred to as "In—Ga—Zn—O-TFT") is adopted. Note that oxide TFTs such as In—Ga—Zn—O-TFTs are particularly effective for when they are adopted as n-channel transistors included in the pixel circuits 40. Note, however, that the present invention does not exclude the use of p-channel oxide TFTs. Note also that transistors that use an oxide semiconductor other than In—Ga—Zn—O (indium gallium zinc oxide) for a channel layer can also be adopted. For example, even when adopting a transistor that uses, for a channel layer, an oxide semiconductor including at least one of indium, gallium, zinc, copper (Cu), silicon (Si), tin (Sn), aluminum (Al), calcium (Ca), germanium (Ge), and lead (Pb), the same effect can be obtained. Furthermore, the present invention does not exclude the use of transistors other than transistors using an oxide semiconductor for a channel layer.

<3. Driving Method>

Next, a driving method in the present embodiment will be described.

<3.1 Summary>

Figure 9:
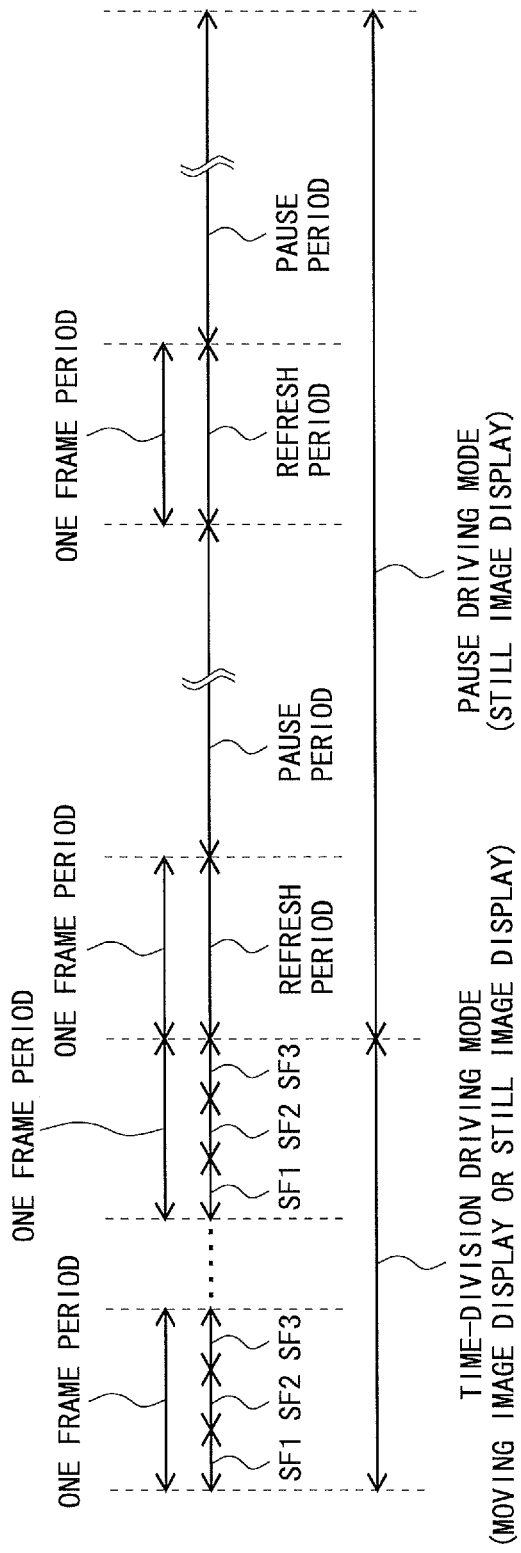
FIG. 9 is a diagram for describing a summary of a driving method in the embodiment.

FIG. 9 is a diagram for describing a summary of a driving method in the present embodiment. As described above, the organic EL display device 1 according to the present embodiment switches the operating mode between the time-division driving mode and the pause driving mode. The operating mode at normal times is the time-division driving mode. When in the time-division driving mode, moving image display or still image display is performed by performing time-division driving that divides one frame period into three subframes SF1 to SF3. More specifically, when in the time-division driving mode, display of an image (moving image or still image) on the display unit 500 is performed by dividing one frame period into three subframes SF1 to SF3 and performing writing of image data to each pixel circuit 40 on a subframe-by-subframe basis, and bringing, in each pixel circuit 40, organic EL elements OLED of different light-emitting colors into a light-emitting state on a subframe-by-subframe basis. When there is no change in image content throughout a period longer than or equal to a given period during operation in the time-division driving mode, the operating mode is switched from the time-division driving mode to the pause driving mode. When in the pause driving mode, a refresh period during which writing of image data to the pixel circuits 40 is performed and a pause period during which the writing of image data to the pixel circuits 40 is brought into a pause state are repeated. By this, when in the pause driving mode, still image display on the display unit 500 is performed at a lower refresh rate than that for when in the time-division driving mode, based on the writing of image data performed during a refresh period. Note that a black display period during which black insertion is performed is present both in the time-division driving mode and in the pause driving mode, but black display periods are omitted in FIG. 9.

<3.2 Operation Performed when in the Time-Division Driving Mode>

Figure 10:
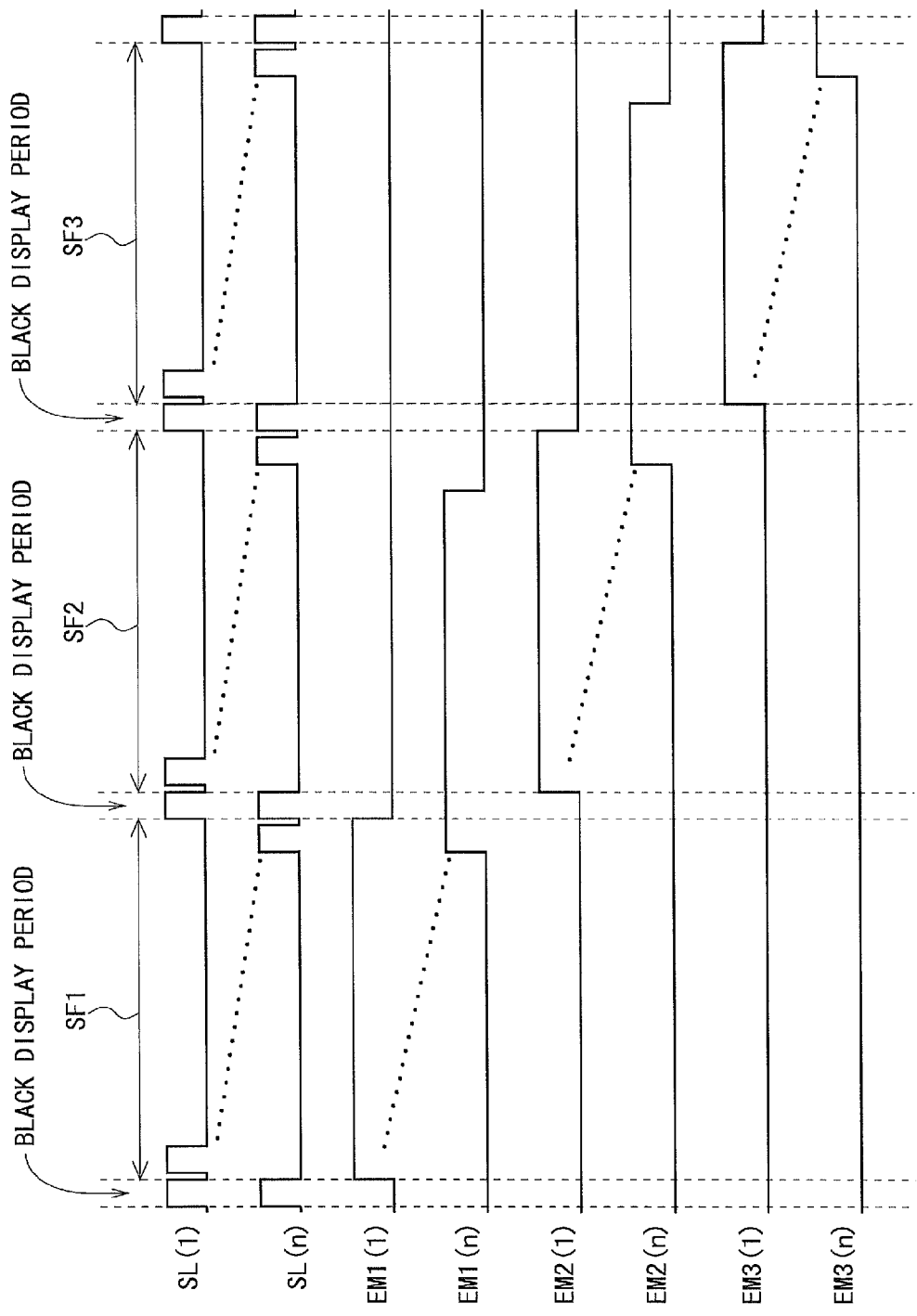
FIG. 10 is a timing chart showing the waveforms of scanning signals and light-emission control signals for when the operating mode is a time-division driving mode in the embodiment.

First, operation performed when the operating mode is the time-division driving mode will be described. FIG. 10 is a timing chart showing the waveforms of scanning signals and light-emission control signals for when the operating mode is the time-division driving mode. As shown in FIG. 10, a flyback period between two consecutive subframes is a black display period. During the black display period, the emission driver brings all of the emission lines EM into the non-selected state, and the gate driver 300 brings all of the scanning signal lines SL(1) to SL(n) into the selected state. In such a state, the source driver 200 applies analog voltages corresponding to a black color, as driving video signals, to all of the data lines DL(1) to DL(m). By this, image data corresponding to a black color is written to all of the pixel circuits 40 in the display unit 500. In addition, all of the organic EL elements OLED in the display unit 500 go into a light-off state by all of the emission lines EM going into the non-selected state, and thus, a black screen is displayed on the display unit 500. By performing writing of image data corresponding to a black color during a black display period (flyback period) in the above-described manner, in each subframe, the organic EL elements OLED are prevented from emitting light at luminance determined according to writing performed in the preceding subframe.

In the first subframe SF1, first, as for the first row, the emission driver brings the first emission line EM1(1) into the selected state and brings the second emission line EM2(1) and the third emission line EM3(1) into the non-selected state. By this, in the first row, the transistor T3 goes into an on state and the transistors T4 and T5 go into an off state in the pixel circuit PIX1, the transistor T4 goes into an on state and the transistors T3 and T5 go into an off state in the pixel circuit PIX2, and the transistor T5 goes into an on state and the transistors T3 and T4 go into an off state in the pixel circuit PIX3 (see FIG. 1). In the above-described state, the gate driver 300 brings the scanning signal line SL(1) into the selected state. By this, in each pixel circuit 40 in the first row, the transistor T2 goes into an on state. As a result, in each pixel circuit 40 in the first row, the capacitor Cst is charged based on a data voltage applied to the data line DL. When the gate driver 300 brings the scanning signal line SL(1) into the non-selected state, in each pixel circuit 40 in the first row, the transistor T2 goes into an off state. By this, a gate-source voltage Vgs held in the capacitor Cst is fixed.

In each pixel circuit 40 in the first row, a drive current according to the magnitude of the gate-source voltage Vgs flows between the drain and source of the transistor T1. Meanwhile, as described above, the first emission line EM1(1) is connected to the gate terminal of the transistor T3 in the pixel circuit PIX1, the gate terminal of the transistor T4 in the pixel circuit PIX2, and the gate terminal of the transistor T5 in the pixel circuit PIX3. Therefore, the drive current is supplied to the organic EL element OLED(R) through the transistor T3 in the pixel circuit PIX1, the drive current is supplied to the organic EL element OLED(G) through the transistor T4 in the pixel circuit PIX2, and the drive current is supplied to the organic EL element OLED (B) through the transistor T5 in the pixel circuit PIX3. As a result, the organic EL element OLED(R) emits light in the pixel circuit PIX1, the organic EL element OLED(G) emits light in the pixel circuit PIX2, and the organic EL element OLED(B) emits light in the pixel circuit PIX3. The emission driver keeps the first emission line EM1(1) in the selected state during a period corresponding to one subframe.

The above-described operation is sequentially performed on the second to nth rows. Furthermore, in the second subframe SF2 and the third subframe SF3, too, the same operation as that for the first subframe SF1 is performed. Note, however, that the emission driver sequentially brings the n second emission lines EM2(1) to EM2(n) into the selected state in the second subframe SF2, and the emission driver sequentially brings the n third emission lines EM3(1) to EM3(n) into the selected state in the third subframe SF3.

Figure 11:
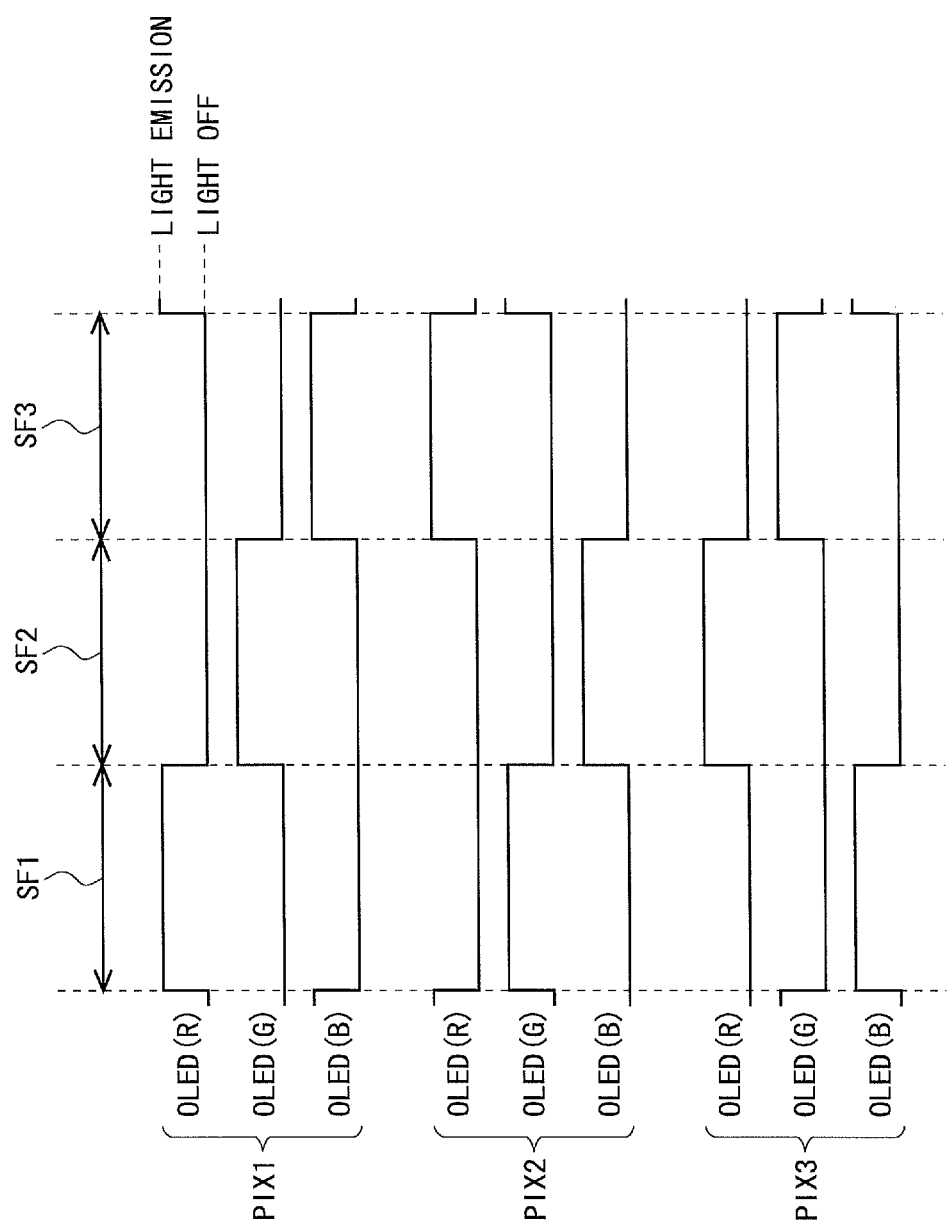
FIG. 11 is a diagram showing the transitions of the light-emitting states of organic EL elements in three pixel circuits included in one group for each subframe during the time-division driving mode in the embodiment.
Figure 12:
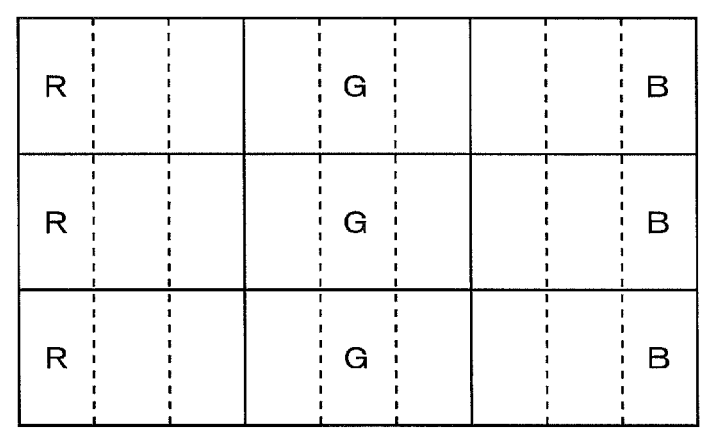
Figures 13, 14:
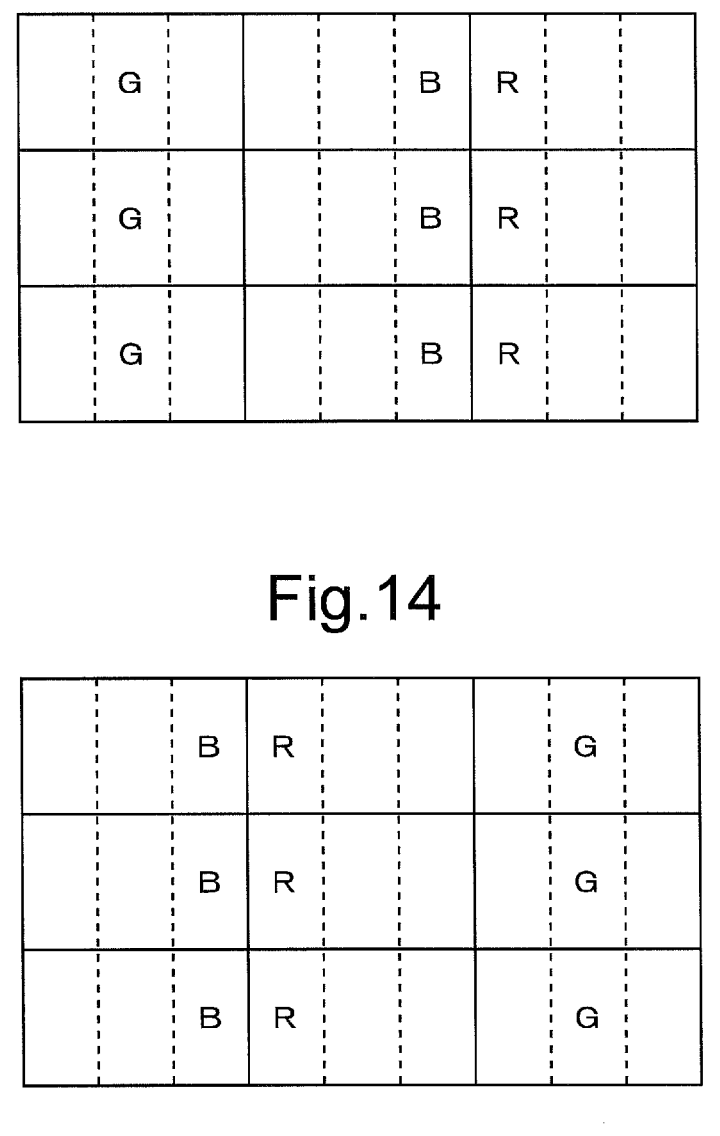

By the above, the transitions of the light-emitting states of the organic EL elements OLED in three pixel circuits PIX1 to PIX3 included in one group for each subframe during the time-division driving mode are as follows (see FIG. 11). In the pixel circuit PIX1, only the red-color organic EL element OLED(R) goes into a light-emitting state in the first subframe SF1, only the green-color organic EL element OLED (G) goes into a light-emitting state in the second subframe SF2, and only the blue-color organic EL element OLED(B) goes into a light-emitting state in the third subframe SF3. In the pixel circuit PIX2, only the green-color organic EL element OLED(G) goes into a light-emitting state in the first subframe SF1, only the blue-color organic EL element OLED(B) goes into a light-emitting state in the second subframe SF2, and only the red-color organic EL element OLED(R) goes into a light-emitting state in the third subframe SF3. In the pixel circuit PIX3, only the blue-color organic EL element OLED(B) goes into a light-emitting state in the first subframe SF1, only the red-color organic EL element OLED(R) goes into a light-emitting state in the second subframe SF2, and only the green-color organic EL element OLED(G) goes into a light-emitting state in the third subframe SF3. As a result, focusing on pixel circuits 40 in 3 rows×3 columns, light-emitting states are as shown in FIG. 12 in the first subframe SF1, light-emitting states are as shown in FIG. 13 in the second subframe SF2, and light-emitting states are as shown in FIG. 14 in the third subframe SF3. During the time-division driving mode, by repeating the above-described light-emitting states, a color image in a state in which one pixel is formed by one pixel circuit 40 is displayed on the display unit 500.

<3.3 Operation Performed when the Mode is Switched from the Time-Division Driving Mode to the Pause Driving Mode>

Figure 15:
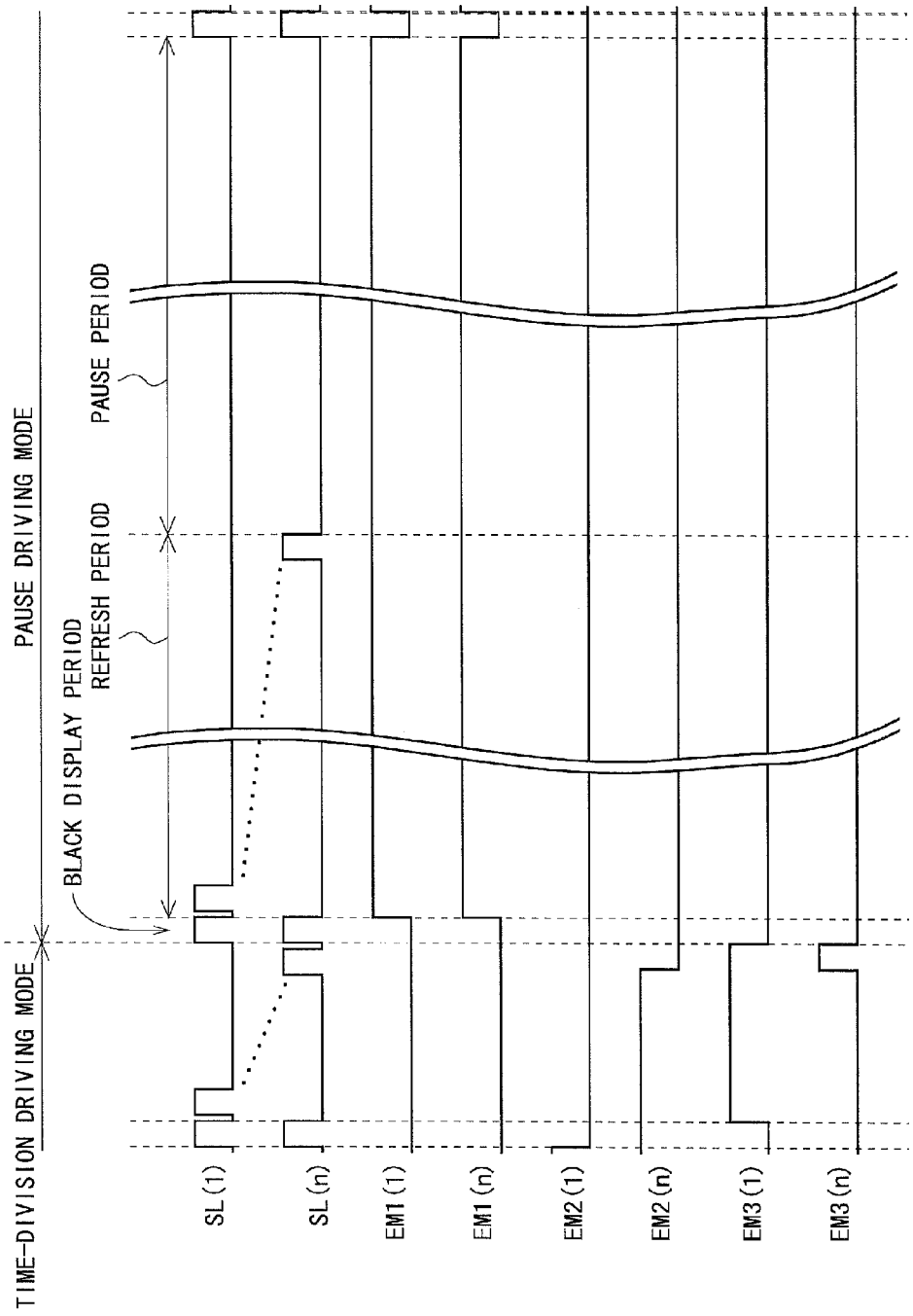
FIG. 15 is a timing chart showing the waveforms of scanning signals and light-emission control signals for when the operating mode is switched from the time-division driving mode to a pause driving mode in the embodiment.

Next, operation performed when the operating mode is switched from the time-division driving mode to the pause driving mode will be described. FIG. 15 is a timing chart showing the waveforms of scanning signals and light-emission control signals for when the operating mode is switched from the time-division driving mode to the pause driving mode. At the time point when the operating mode is switched from the time-division driving mode to the pause driving mode, the emission driver brings all of the emission lines EM into the non-selected state. In addition, the gate driver 300 brings all of the scanning signal lines SL(1) to SL(n) into the selected state at the same time. In such a state, the source driver 200 applies analog voltages corresponding to a black color, as driving video signals, to all of the data lines DL(1) to DL(m). By this, as with a flyback period between two consecutive subframes upon the time-division driving mode, image data corresponding to a black color is written to all of the pixel circuits 40 in the display unit 500, a black screen is displayed on the display unit 500 by all of the organic EL elements OLED in the display unit 500 going into a light-off state. As described above, when the operating mode is switched from the time-division driving mode to the pause driving mode, black insertion is performed. By thus performing black insertion, a state during the time-division driving mode is reset. Then, during a refresh period after the black insertion, writing of image data to the pixel circuits 40 is performed according to an image to be displayed during the pause driving mode.

<3.4 Operation Performed when in the Pause Driving Mode>

Figure 16:
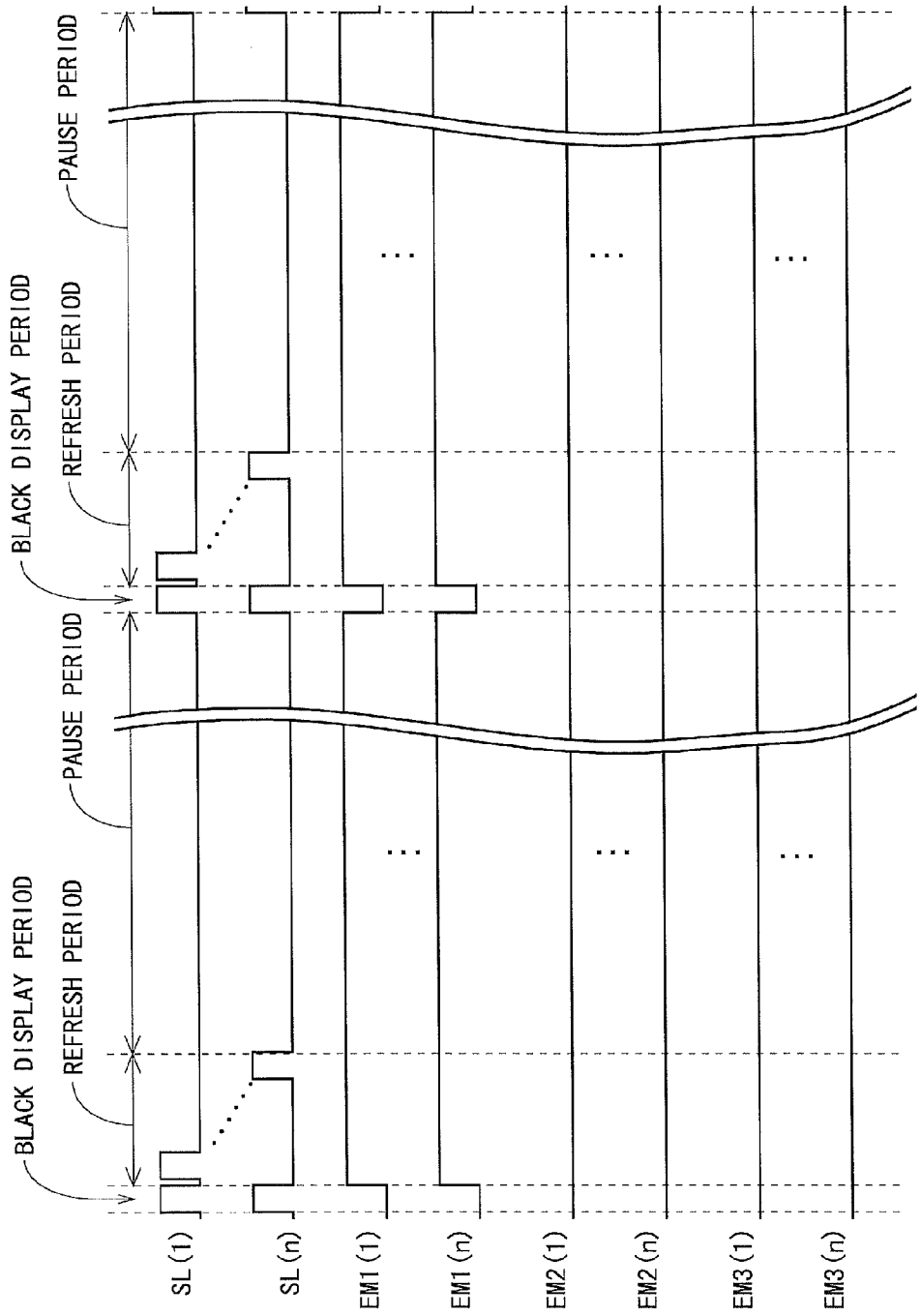
FIG. 16 is a timing chart showing the waveforms of scanning signals and light-emission control signals for when the operating mode is the pause driving mode in the embodiment.

Next, operation performed when the operating mode is the pause driving mode will be described. FIG. 16 is a timing chart showing the waveforms of scanning signals and light-emission control signals for when the operating mode is the pause driving mode. As shown in FIG. 16, when in the pause driving mode, a black display period, a refresh period, and a pause period are repeated. As such, black insertion is performed not only when the mode is switched from the time-division driving mode to the pause driving mode, but also when the period is switched from a pause period to a refresh period during the pause driving mode.

In the pause driving mode, when a black display period ends, a refresh period appears. During a refresh period immediately after the mode is switched from the time-division driving mode to the pause driving mode, writing of data of a still image to be displayed from now on is performed. During the second and subsequent refresh periods during the pause driving mode, when there is no change in an image to be displayed, writing of the same data as that of a still image written during the last refresh period is performed, and when there is a change in an image to be displayed, writing of data of a new still image is performed.

As shown in FIG. 16, during a refresh period, the emission driver brings all of the first emission lines EM1(1) to EM1(n) into the selected state and brings all of the second emission lines EM2(1) to EM2 (n) and all of the third emission lines EM3(1) to EM3(n) into the non-selected state. Note that all of the first emission lines EM1(1) to EM1(n) are kept in the selected state until the start time point of the next black display period. Specifically, when the operating mode is switched to the pause driving mode, all of the first emission lines EM1(1) to EM1(n) are kept in the selected state throughout a refresh period and a pause period. In addition, during the refresh period, the gate driver 300 sequentially brings the n scanning signal lines SL(1) to SL(n) into the selected state for a predetermined period. In the above-described state, the source driver 200 applies data voltages according to an image to be displayed during the pause driving mode, as driving video signals, to the data lines DL, according to each scanning signal line SL going into the selected state. Here, as described above, the first emission line EM1(1) is connected to the gate terminal of the transistor T3 in the pixel circuit PIX1, the gate terminal of the transistor T4 in the pixel circuit PIX2, and the gate terminal of the transistor T5 in the pixel circuit PIX3. Therefore, a drive current is supplied to the organic EL element OLED(R) through the transistor T3 in the pixel circuit PIX1, a drive current is supplied to the organic EL element OLED(G) through the transistor T4 in the pixel circuit PIX2, and a drive current is supplied to the organic EL element OLED(B) through the transistor T5 in the pixel circuit PIX3. As a result, during the refresh period, the organic EL element OLED(R) emits light in the pixel circuit PIX1, the organic EL element OLED(G) emits light in the pixel circuit PIX2, and the organic EL element OLED(B) emits light in the pixel circuit PIX3.

During a pause period, the emission driver keeps all of the first emission lines EM1(1) to EM1($n$) in the selected state and keeps all of the second emission lines EM2(1) to EM2($n$) and all of the third emission lines EM3(1) to EM3($n$) in the non-selected state. By this, the transistor T3 is kept in the on state in the pixel circuit PIX1, the transistor T4 is kept in the on state in the pixel circuit PIX2, and the transistor T5 is kept in the on state in the pixel circuit PIX3. Hence, the organic EL elements OLED in each pixel circuit 40 keep the same light-emitting states as those for the refresh period. Specifically, as with the refresh period, the organic EL element OLED(R) emits light in the pixel circuit PIX1, the organic EL element OLED(G) emits light in the pixel circuit PIX2, and the organic EL element OLED(B) emits light in the pixel circuit PIX3. By the above, a still image displayed during the refresh period is continuously displayed during the pause period as well.

Figure 17:
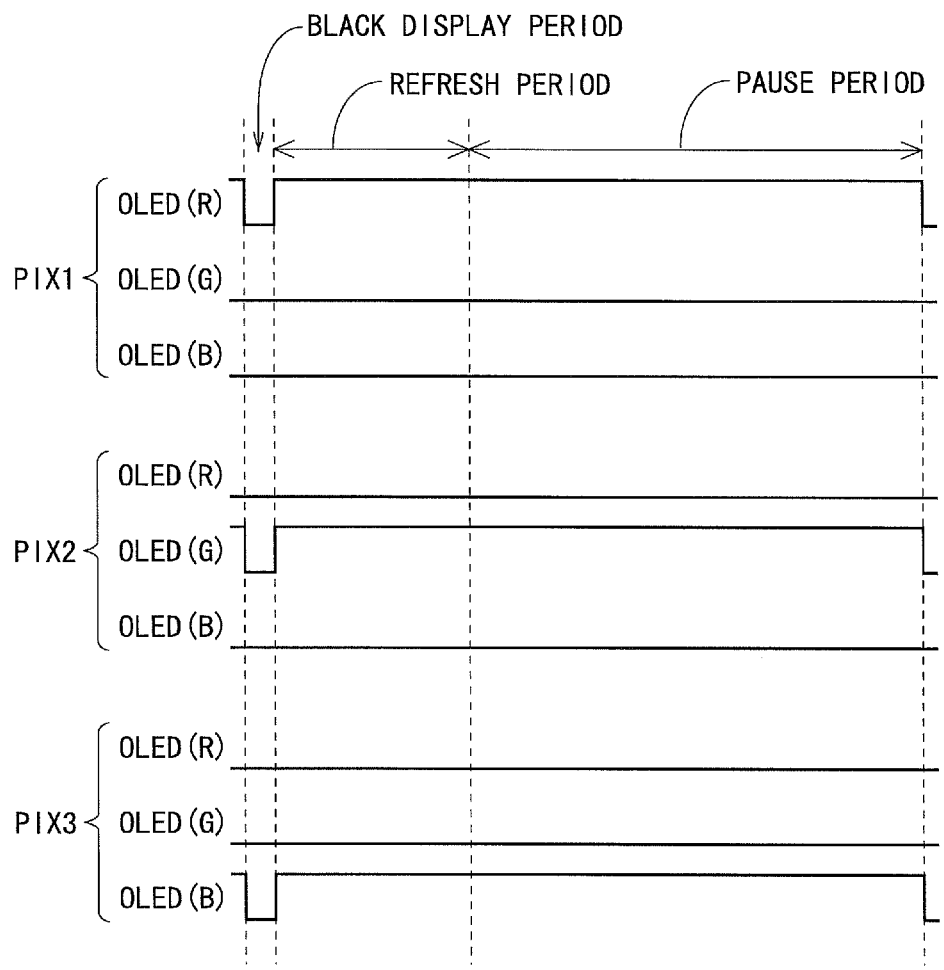
FIG. 17 is a diagram showing the transitions of the light-emitting states of organic EL elements in three pixel circuits included in one group during the pause driving mode in the embodiment.
Figure 18:
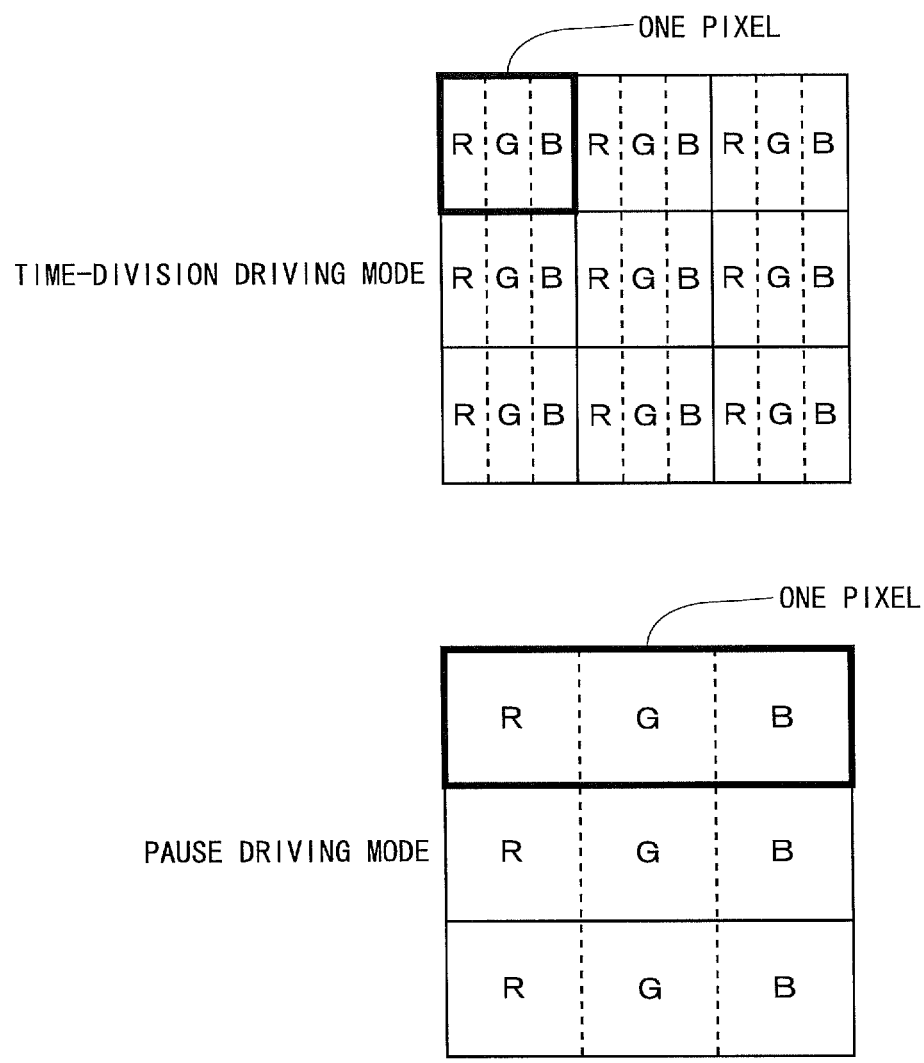
FIG. 18 is a diagram for describing a display image during the pause driving mode in the embodiment.

By the above, the transitions of the light-emitting states of the organic EL elements OLED in three pixel circuits PIX1 to PIX3 included in one group during the pause driving mode are as follows (see FIG. 17). During a black display period, all of the organic EL elements OLED in the display unit 500 go into a light-off state. In the pixel circuit PIX1, only the red-color organic EL element OLED(R) goes into a light-emitting state throughout a refresh period and a pause period. In the pixel circuit PIX2, only the green-color organic EL element OLED(G) goes into a light-emitting state throughout the refresh period and the pause period. In the pixel circuit PIX3, only the blue-color organic EL element OLED(B) goes into a light-emitting state throughout the refresh period and the pause period. The above-described state is repeated during a period during which the operating mode is the pause driving mode. That is, in the pause driving mode, unlike in the time-division driving mode, the organic EL elements OLED for a plurality of colors do not sequentially emit light in each pixel circuit 40. By the above, during the pause driving mode, an image in a state in which one pixel is formed by three pixel circuits PIX1 to PIX3 included in one group is displayed on the display unit 500. Specifically, as shown in FIG. 18, one pixel in the time-division driving mode corresponds to one sub-pixel in the pause driving mode, and one pixel in the pause driving mode corresponds to three pixels in the time-division driving mode. In this manner, when the operating mode is the pause driving mode, an image with a ⅓ resolution of an image displayed when the operating mode is the time-division driving mode is displayed on the display unit 500.

Meanwhile, during the pause period, all of the scanning signal lines SL(1) to SL($n$) are kept in the non-selected state. In addition, during the pause period, data voltages are not applied to the data lines DL from the source driver 200. That is, during the pause period, the gate driver 300 and the source driver 200 go into a pause state. Hence, the power consumption of the gate driver 300 and the source driver 200 during the pause period is zero.

Note that although only the first emission lines EM1 are brought into the selected state during a refresh period and a pause period in the above-described example, the present invention is not limited thereto. Only the second emission lines EM2 may be brought into the selected state during a refresh period and a pause period, or only the third emission lines EM3 may be brought into the selected state during a refresh period and a pause period.

<4. Effects>

According to the present embodiment, in the organic EL display device 1 adopting time-division driving, pause driving (driving method for providing a period during which the operation of the peripheral drivers pauses) can be performed. This will be described below. According to the conventional configuration in which time-division driving is performed, only organic EL elements for any one color in the entire display unit can be brought into a light-emitting state in one vertical scanning. Hence, even if pause driving is adopted, organic EL elements for a plurality of colors cannot be brought into a light-emitting state simultaneously, and thus, a desired color image cannot be displayed. Regarding this, in the present embodiment, one group is formed by three pixel circuits PIX1 to PIX3 each including a red-color organic EL element OLED(R), a green-color organic EL element OLED(G), and a blue-color organic EL element OLED(B). Then, the three pixel circuits PIX1 to PIX3 are configured such that organic EL elements OLED of different light-emitting colors can be brought into a light-emitting state in the three pixel circuits PIX1 to PIX3 included in each group. Hence, by bringing the red-color organic EL elements OLED(R), the green-color organic EL elements OLED(G), and the blue-color organic EL elements OLED(B) into a light-emitting state during one vertical scanning with the resolution reduced to ⅓ of that for when in the time-division driving mode, a desired color image can be displayed. As such, since a desired color image can be displayed in one vertical scanning, pause driving can be performed upon still image display. As described above, in the present embodiment, in the organic EL display device 1 adopting time-division driving, pause driving can be performed.

Meanwhile, as described above, according to conventional art, the power consumption of each peripheral driver for when the time-division driving is adopted is three times higher than that for when the general driving is adopted (see FIG. 39). On the other hand, according to the present embodiment, since pause driving can be performed as described above, an increase in power consumption caused by the adoption of time-division driving can be effectively suppressed. This will be described below.

When the operating mode is the pause driving mode, the states of the components during a black display period, a refresh period, and a pause period are as shown in FIG. 19. As can be grasped from FIG. 19, during the refresh period, the operation of the source driver 200, the scanning operation of the gate driver 300 (the operation of sequentially bringing the scanning signal lines SL into the selected state one by one), and the scanning operation of the emission driver (the operation of sequentially bringing the emission lines EM into the selected state one by one) are in an on state. Note, however, that the driving frequency during the refresh period is one-third of that during the time-division driving mode. Further, during the pause period, the operation of the source driver 200, the scanning operation of the gate driver 300, and the scanning operation of the emission driver are in an off state. By the above, as shown in FIG. 20, if the magnitude of the power consumption of the peripheral drivers during the time-division driving mode is "9" (the unit is any unit), then the magnitude of the power consumption of the peripheral drivers during the refresh period during the pause driving mode is "3", and the magnitude of the power consumption of the peripheral drivers during the pause period during the pause driving mode is substantially "0". FIG. 21 is a diagram showing the driving frequency and power consumption of the peripheral drivers during the time-division driving mode and the driving frequency and power consumption of the peripheral drivers during the pause period during the pause driving mode. Although the power consumption is three times higher during the time-division driving mode compared to the case of adopting the general driving, it can be grasped from FIG. 21 that the power consumption of the peripheral drivers can be significantly reduced by adopting pause driving. Note that, as for the first emission driver 401, it keeps all of the first emission lines EM1(1) to EM1(n) in the selected state and thus only direct-current power is consumed, during the refresh period and the pause period.

As described above, according to the present embodiment, the operation of the peripheral drivers can be stopped by performing pause driving when a display image is a still image. By this, in the organic EL display device 1 adopting time-division driving, power consumption can be reduced over the conventional one.

In addition, in the present embodiment, for the transistors in the pixel circuits 40, oxide TFTs (thin-film transistors using an oxide semiconductor for a channel layer) such as In—Ga—Zn—O-TFTs are adopted. The off-leakage current (current flowing through when in an off state) in the oxide TFTs is very small compared to that in the thin-film transistors using low-temperature polysilicon, amorphous silicon, or the like, for a channel layer. For example, the off-leakage current in an In—Ga—Zn—O-TFT is $\frac{1}{1000}$ or less of that in an LTPS-TFT (thin-film transistor using low-temperature polysilicon for a channel layer). Hence, according to the present embodiment in which oxide TFTs such as In—Ga—Zn—O-TFTs are adopted, the gate-source voltage Vgs of the transistor T1 (see FIG. 8) can be held for a longer period of time than the conventional one. Accordingly, by increasing the length of the pause period upon the pause driving mode to reduce the refresh rate, power consumption can be significantly reduced over the conventional one.

<5. Variants>

Variants of the above-described embodiment will be described below.

<5.1 First Variant>

In the above-described embodiment, the description is made on the presumption that one group is formed by three pixel circuits 40 arranged side by side in the extension direction of the scanning signal lines SL, and that one pixel is formed by three pixel circuits 40 included in each group during the pause driving mode. However, the present invention is not limited thereto. One pixel may be formed by k×3 pixel circuits 40 corresponding to k consecutive rows in an extension direction of the data lines DL during the pause driving mode. This will be described below.

Figure 22:
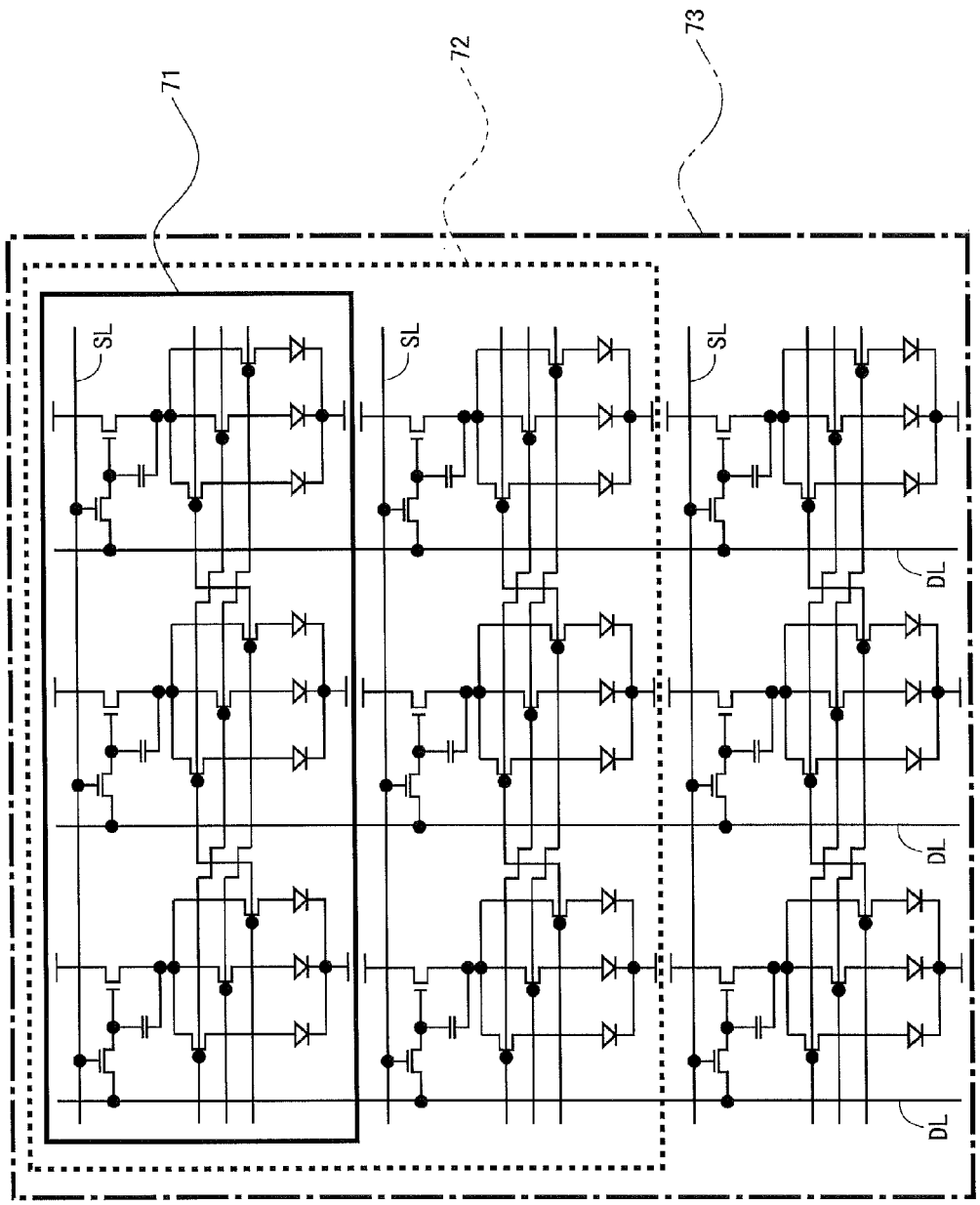
FIG. 22 is a diagram for describing the way of forming one pixel during the pause driving mode in a first variant of the embodiment.
Figure 24:
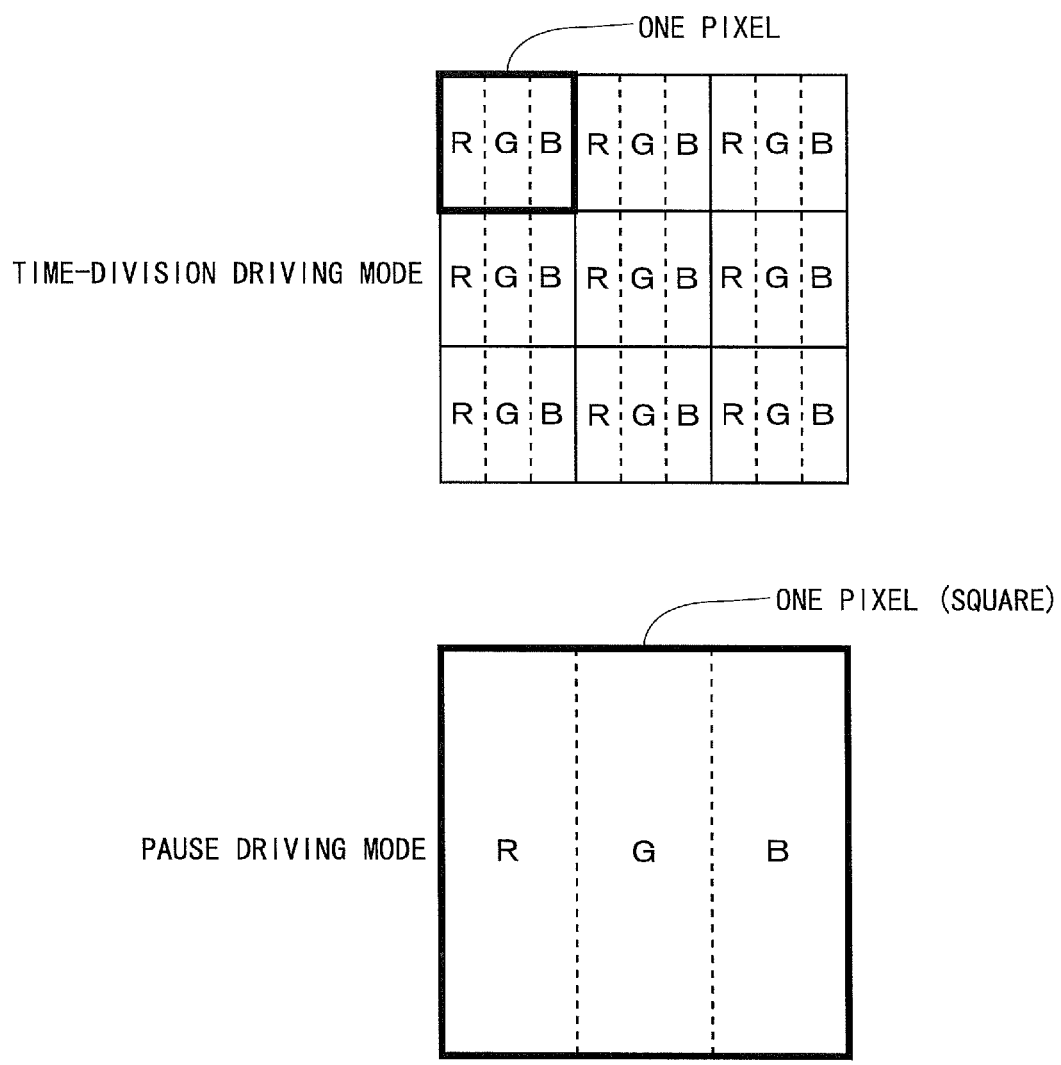
FIG. 24 is a diagram for describing the case of forming one pixel by nine pixel circuits included in three consecutive rows in the extension direction of data lines in the first variant of the embodiment.

In the above-described embodiment, one pixel during the pause driving mode is formed by three pixel circuits 40 in one row, as indicated by reference character 71 in FIG. 22. However, one pixel during the pause driving mode may be formed as shown below. For example, as indicated by reference character 72 in FIG. 22, one pixel may be formed by six pixel circuits 40 included in two consecutive rows in the extension direction of the data lines DL. In this case, as shown in FIG. 23, one pixel in the pause driving mode corresponds to six pixels in the time-division driving mode. By this, when in the pause driving mode, an image with a ⅙ resolution of an image displayed when in the time-division driving mode is displayed on the display unit 500. In addition, for example, as indicated by reference character 73 in FIG. 22, one pixel may be formed by nine pixel circuits 40 included in three consecutive rows in the extension direction of the data lines DL. In this case, as shown in FIG. 24, one pixel in the pause driving mode corresponds to nine pixels in the time-division driving mode. By this, when in the pause driving mode, an image with a ⅑ resolution of an image displayed when in the time-division driving mode is displayed on the display unit 500. Note that in the example shown in FIG. 22, when one pixel is formed by nine pixel circuits 40 included in three rows, the shape of the pixel is a square. By thus configuring the shape of the pixel for when in the pause driving mode to be a square, a more natural still image is displayed on the display unit 500 during the pause driving mode.

Figure 25:
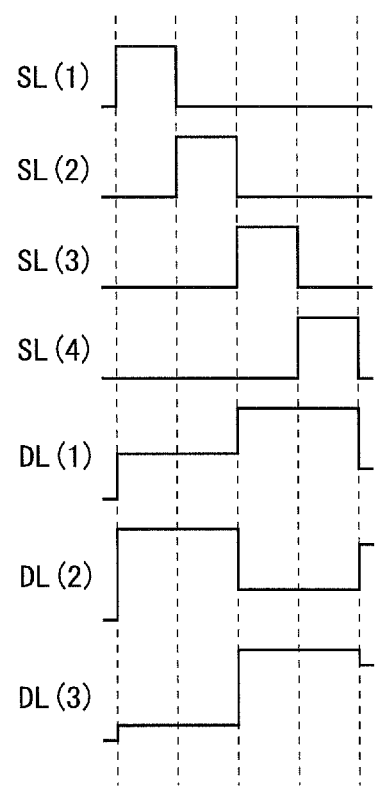
FIG. 25 is a timing chart for describing a method for driving the data lines in the first variant of the embodiment.

Meanwhile, when one pixel is formed by k×3 pixel circuits corresponding to k consecutive rows in the extension direction of the data lines DL, the source driver 200 does not need to change a data voltage applied to each data line DL, during a period during which k scanning signal lines SL are sequentially brought into the selected state, in the above-described refresh period. For example, when one pixel is formed by six pixel circuits 40 included in two consecutive rows in the extension direction of the data lines DL, the source driver 200 has only to change, as shown in FIG. 25, the magnitude of a data voltage applied to each data line DL every time two scanning signal lines SL are selected. By this, the power consumption of the source driver 200 during the refresh period can be reduced.

<5.2 Second Variant>

In the above-described embodiment, the pixel circuit 40 has the configuration shown in FIG. 8. However, the present invention is not limited thereto. For example, a configuration can also be adopted in which a reference voltage which is a predetermined constant voltage is provided to the gate terminal of the transistor T1 (configuration of the present variant).

Figure 26:
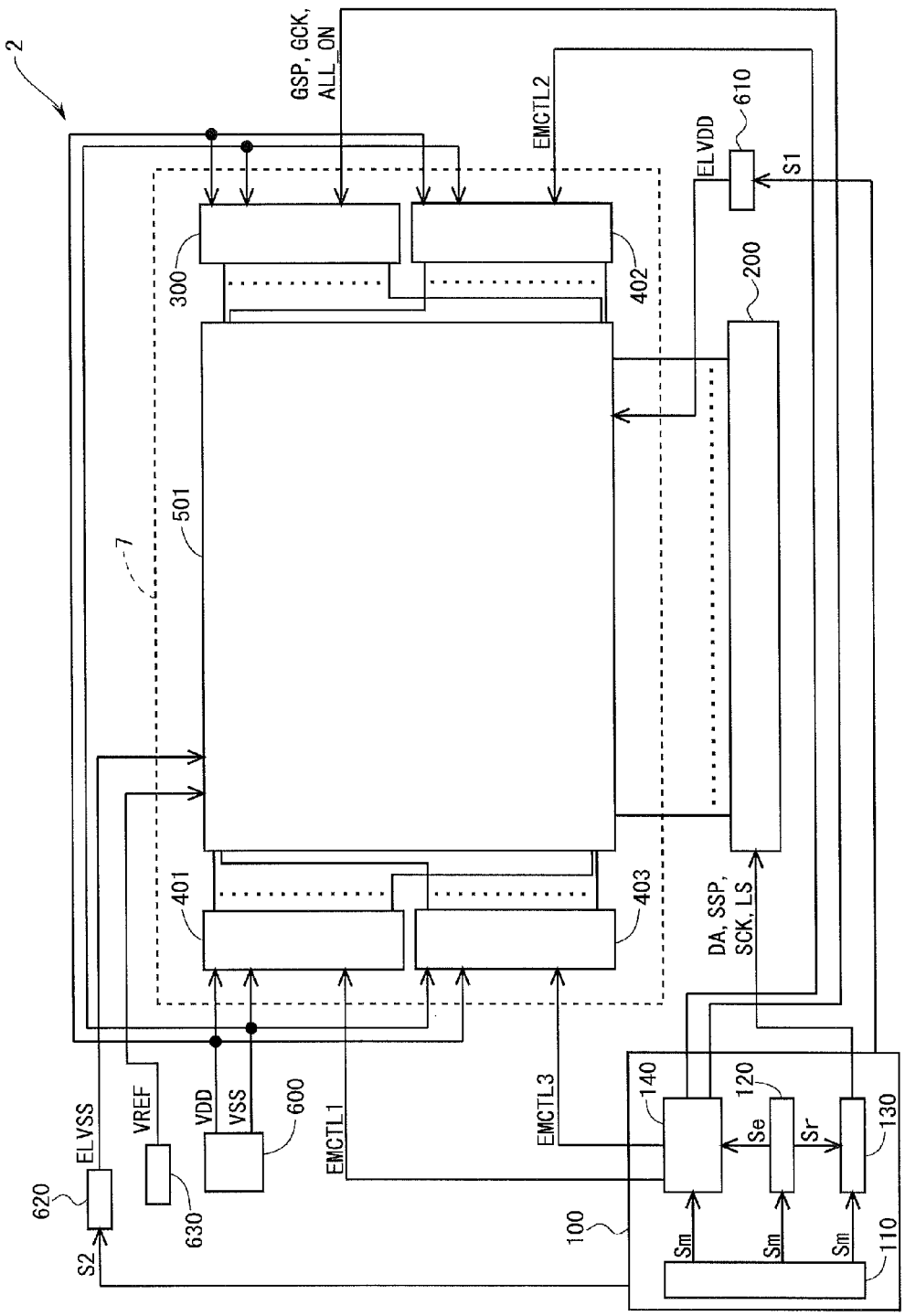
FIG. 26 is a block diagram showing an overall configuration of an organic EL display device in a second variant of the embodiment.

FIG. 26 is a block diagram showing an overall configuration of an active matrix-type organic EL display device 2 according to the present variant. As shown in FIG. 26, in the present variant, the organic EL display device 2 is provided with a reference voltage power supply 630, in addition to the components in the above-described embodiment (see FIG. 2). The reference voltage power supply 630 supplies a reference voltage VREF to an organic EL panel 7. Note that, in the following, a power supply line through which the reference voltage VREF is supplied is referred to as "reference voltage line", and the reference voltage line is denoted by reference character REF.

Figure 27:
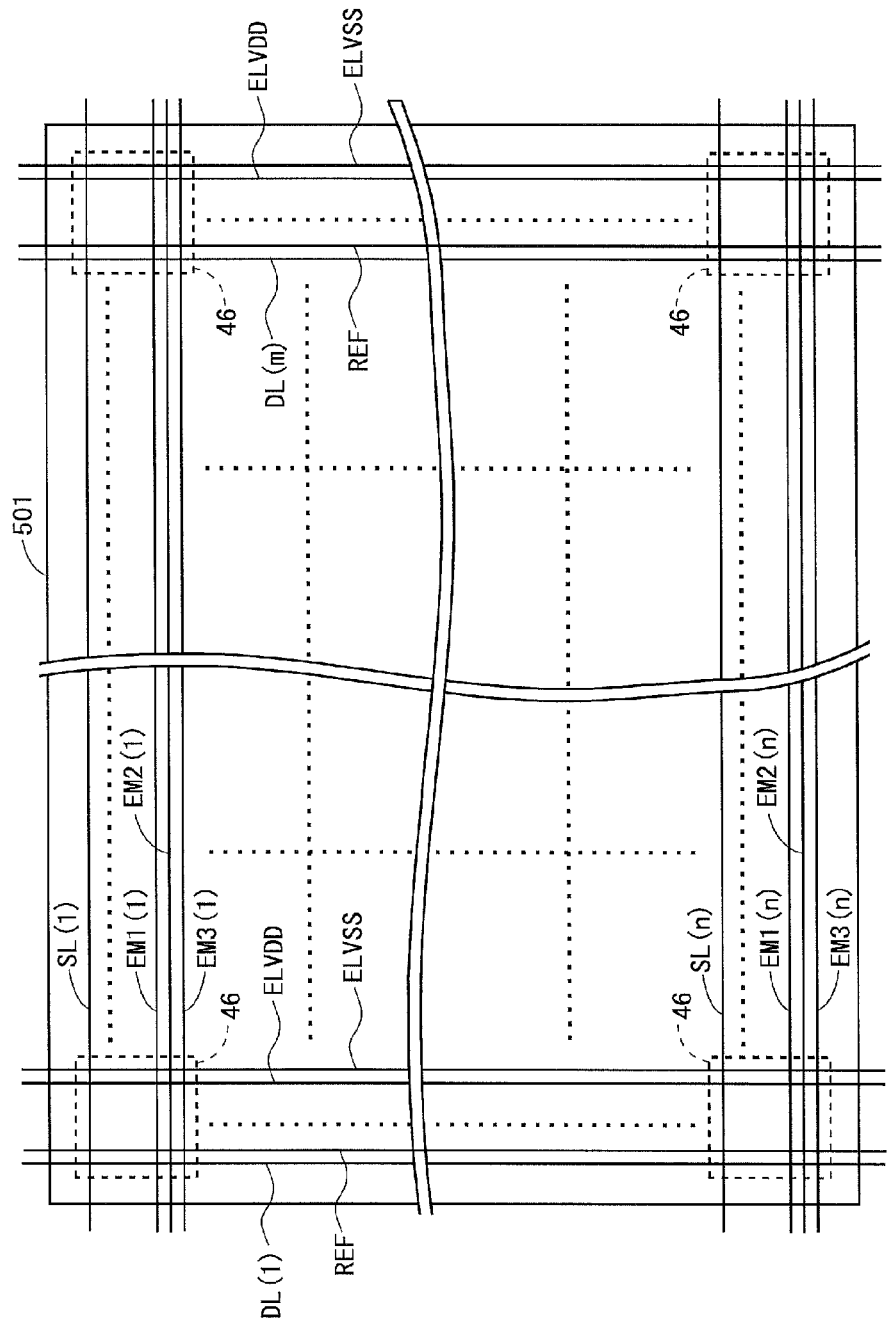
FIG. 27 is a diagram for describing a configuration of a display unit in the second variant of the embodiment.

FIG. 27 is a diagram for describing a configuration of a display unit 501 in the present variant. As shown in FIG. 27, in the present variant, the reference voltage lines REF are disposed in addition to the components in the above-described embodiment (see FIG. 3) in the display unit 501. By the reference voltage lines REF, a common reference voltage VREF is supplied to all pixel circuits 46 in the display unit 501.

Figure 28:
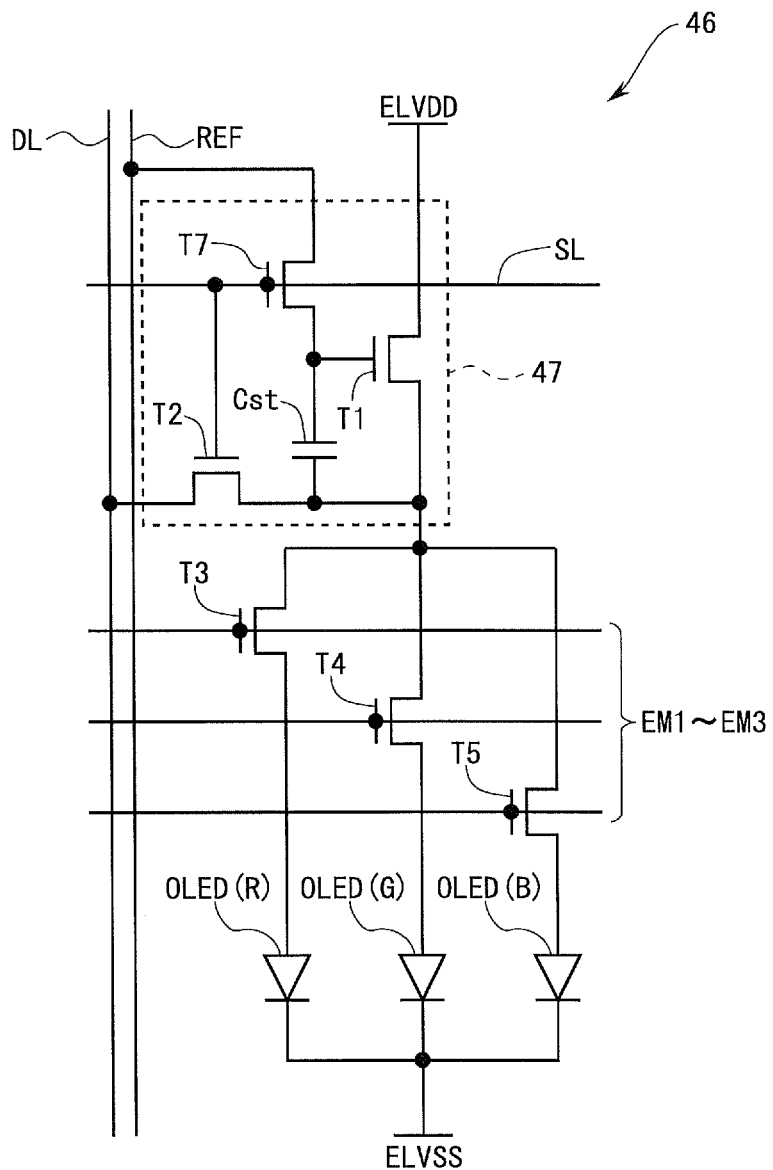
FIG. 28 is a circuit diagram showing a configuration of a pixel circuit in the second variant of the embodiment.

FIG. 28 is a circuit diagram showing a configuration of a pixel circuit 46 in the present variant. The pixel circuit 46 shown in FIG. 28 forms one pixel at normal times. The pixel circuit 46 is provided corresponding to each of intersections of m data lines DL(1) to DL(m) and the n scanning signal lines SL(1) to SL(n) which are disposed in the display unit 501. As shown in FIG. 28, the pixel circuit 46 includes six transistors T1 to T5 and T7, one capacitor Cst, and three organic EL elements OLED(R), OLED(G), and OLED(B). As with the above-described embodiment, the transistor T1 is a drive transistor and the transistor T2 is an input transistor. The transistor T7 functions as a reference voltage supply control transistor that controls the supply of a reference voltage VREF to a gate terminal of the transistor T1. The transistors T3 to T5 and the organic EL elements OLED(R), OLED(G), and OLED(B) are the same as those in the above-described embodiment and thus a description thereof is omitted.

Note that, in the present variant, a drive current control unit 47 that controls a drive current for bringing the organic EL elements OLED into a light-emitting state is implemented by the transistor T1, the transistor T2, the transistor T7, and the capacitor Cst.

The transistor T1 is connected at its gate terminal to a source terminal of the transistor T7, connected at its drain terminal to a high-level power supply line ELVDD, and connected at its source terminal to drain terminals of the transistors T3 to T5. The transistor T2 is connected at its gate terminal to the scanning signal line SL, connected at its drain terminal to the source terminal of the transistor T1, and connected at its source terminal to the data line DL. The transistor T7 is provided between the reference voltage line REF and the gate terminal of the transistor T1. The transistor T7 is connected at its gate terminal to the scanning signal line SL, connected at its drain terminal to the reference voltage line REF, and connected at its source terminal to the gate terminal of the transistor T1. The capacitor Cst is connected at its one end to the gate terminal of the transistor T1 and connected at its other end to the source terminal of the transistor T1.

Figure 29:
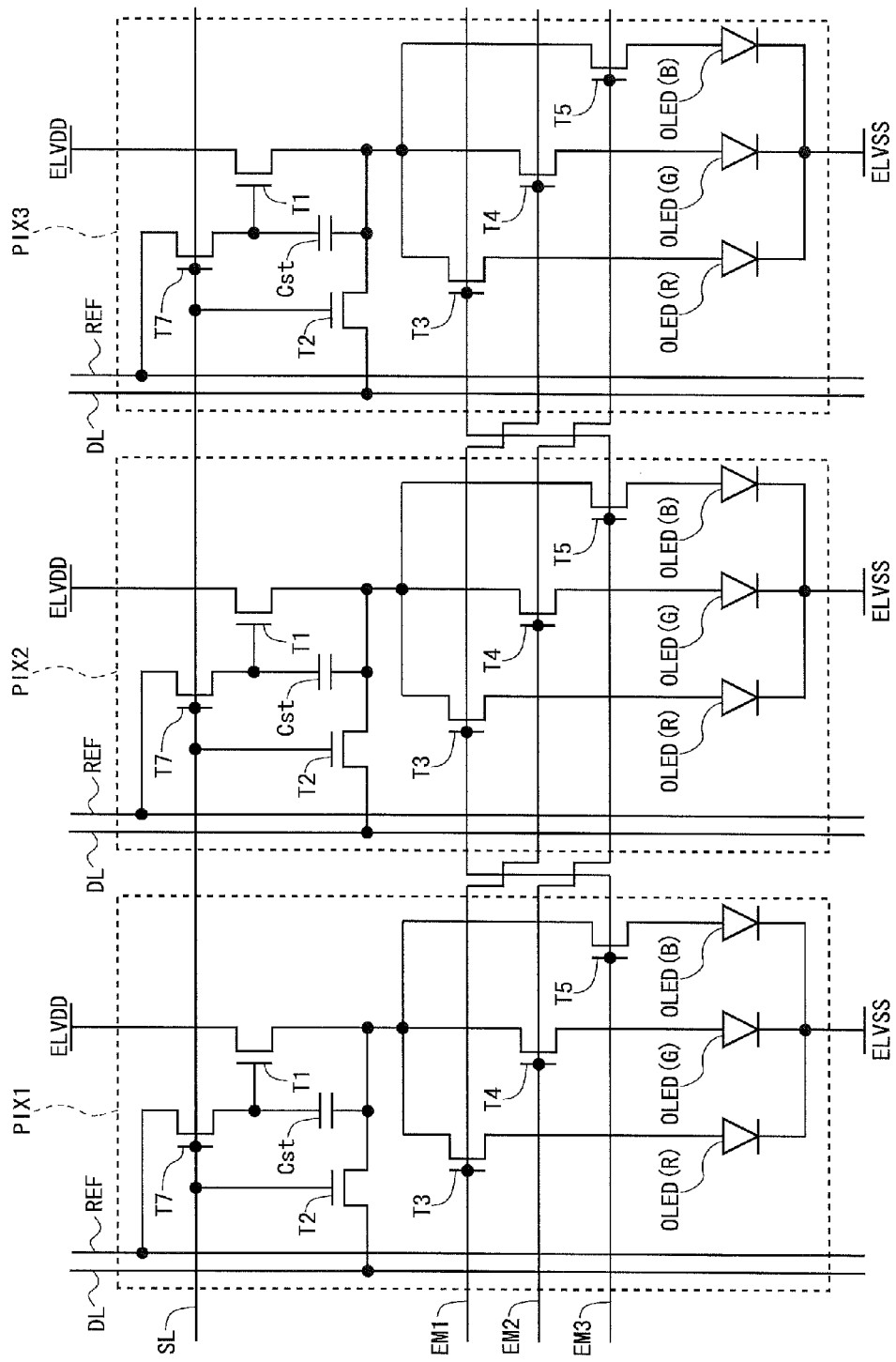
FIG. 29 is a circuit diagram showing a configuration of three pixel circuits included in one group in the second variant of the embodiment.

As with the above-described embodiment, in the present variant, too, three pixel circuits 46 arranged side by side in an extension direction of the scanning signal lines SL are considered one group. Then, when the operating mode is the pause driving mode, one pixel is formed by three pixel circuits 46 included in each group. FIG. 29 is a circuit diagram showing a configuration of three pixel circuits PIX1 to PIX3 included in one group in the present variant. A connection relationship between first to third emission lines EM1 to EM3 and the gate terminals of the transistors T3 to T5 included in the three pixel circuits PIX1 to PIX3 is the same as that of the above-described embodiment.

In the above-described configuration, the same operation as that of the above-described embodiment is performed generally. Note, however, that operation performed when writing to the pixel circuit 46 is performed differs from that of the above-described embodiment. This will be described below (see FIG. 28). When the scanning signal line SL is in the non-selected state, the transistor T2 and the transistor T7 are in an off state. Therefore, the pixel circuit 46 is in a state in which a gate-source voltage Vgs according to the last writing is held in the capacitor Cst. When the scanning signal line SL goes into the selected state, the transistor T2 and the transistor T7 go into an on state. By the transistor T2 going into an on state, a data voltage Vdata is supplied to the source terminal of the transistor T1 from the data line DL through the transistor T2. In addition, by the transistor T7 going into an on state, a reference voltage VREF is supplied to the gate terminal of the transistor T1 from the reference voltage line REF through the transistor T7. When the scanning signal line SL goes into the non-selected state, the transistor T2 and the transistor T7 go into an off state. By this, the gate-source voltage Vgs held in the capacitor Cst is fixed. Specifically, a voltage corresponding to the difference between the reference voltage VREF and the data voltage Vdata is the gate-source voltage Vgs. A drive current according to the magnitude of the gate-source voltage Vgs flows between the drain and source of the transistor T1. Then, the organic EL element OLED(R) emits light based on the drive current when the transistor T3 is in an on state, the organic EL element OLED(G) emits light based on the drive current when the transistor T4 is in an on state, and the organic EL element OLED(B) emits light based on the drive current when the transistor T5 is in an on state.

<5.3 Third Variant>

In the above-described embodiment, the emission lines EM that are brought into the selected state when the operating mode is the pause driving mode are fixed to the first emission lines EM1 among the first to third emission lines EM1 to EM3. In this case, for example, in the pixel circuit PIX1 in FIG. 1, the level of degradation of the transistor T3 becomes greater than the levels of degradation of the transistors T4 and T5 as time proceeds, and also the level of degradation of the organic EL element OLED(R) becomes greater than the levels of degradation of the organic EL elements OLED(G) and OLED(B) as time proceeds. Hence, in the present variant, in order to prevent the occurrence of bias in the levels of degradation of transistors and degradation of organic EL elements in a pixel circuit, a configuration is adopted in which the emission lines EM that are brought into the selected state when the operating mode is the pause driving mode are changed as appropriate.

Figure 30:
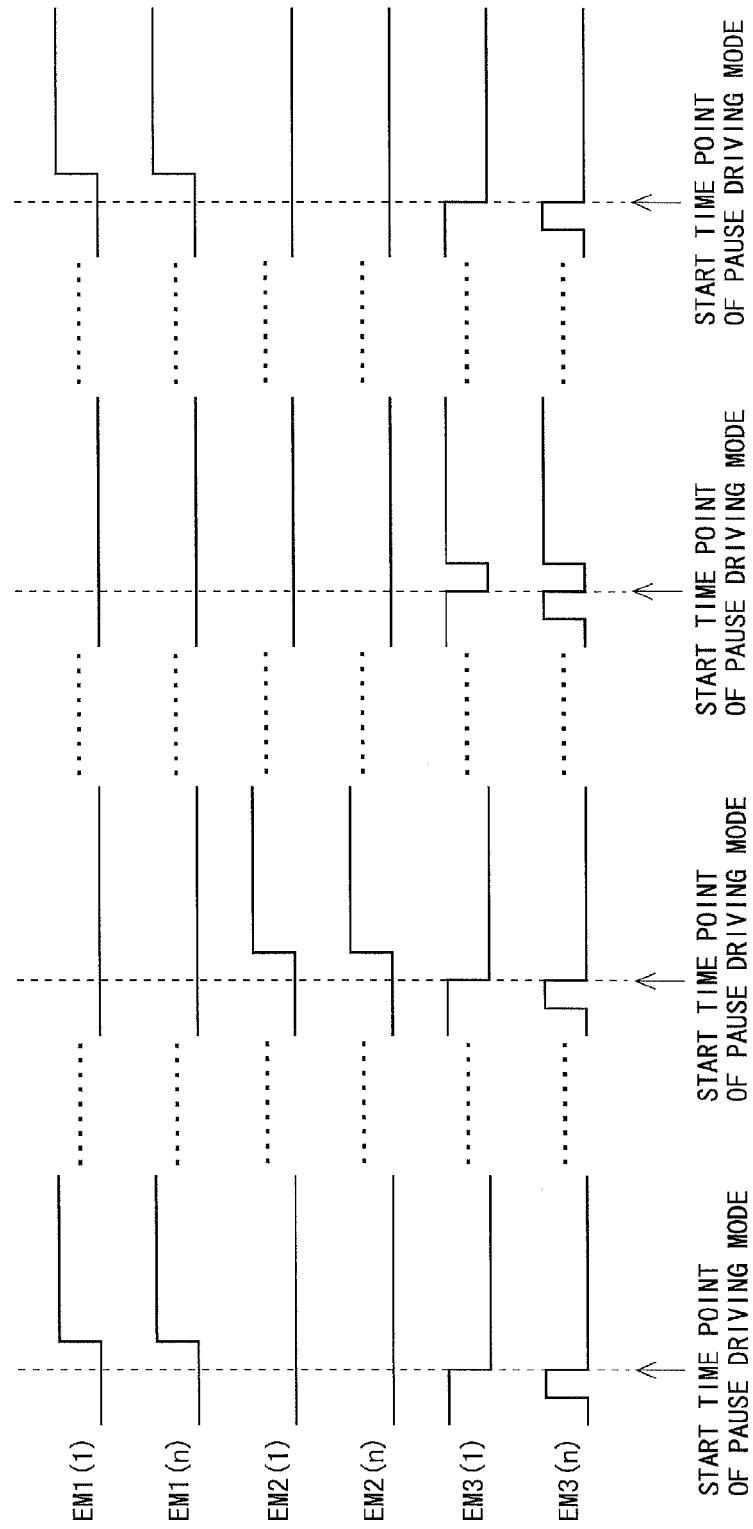
FIG. 30 is a diagram for describing an operation of emission drivers in a third variant of the embodiment.

In the present variant, for example, as shown in FIG. 30, every time the mode is switched from the time-division driving mode to the pause driving mode, the emission driver changes the emission lines EM that are brought into the selected state during the pause driving mode. In addition, the configuration may be such that, for example, every time the power of the device is turned on, the emission lines EM that are brought into a selected state during the pause driving mode are changed. In the above-described manner, according to the present variant, the occurrence of bias in the levels of degradation of transistors and degradation of organic EL elements in a pixel circuit is prevented.

<5.4 Fourth Variant>

Figure 31:
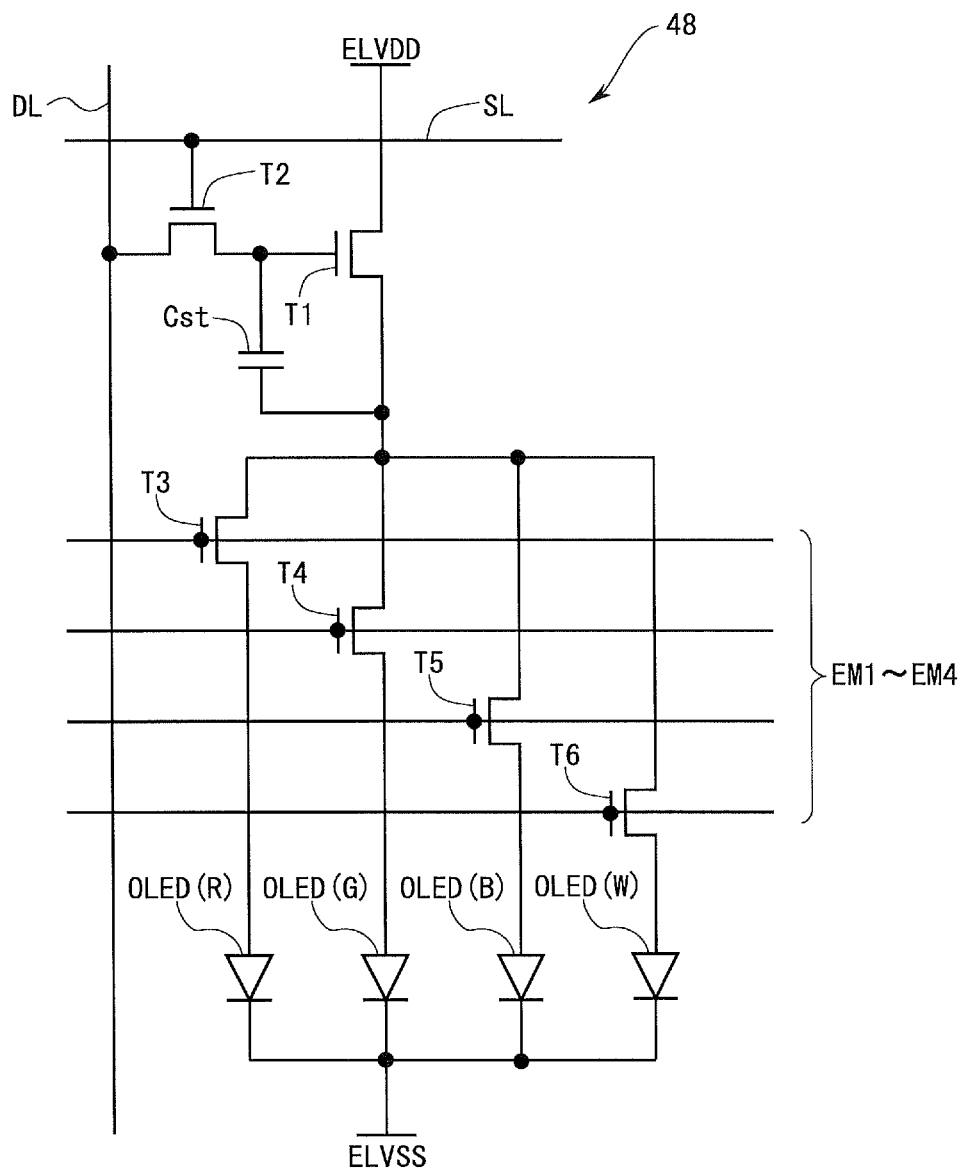
FIG. 31 is a circuit diagram showing a configuration of a pixel circuit in a fourth variant of the embodiment.

In the above-described embodiment, each pixel circuit 40 includes three organic EL elements OLED(R), OLED(G), and OLED(B), and one frame period is divided into three subframes upon the time-division driving mode. However, the present invention is not limited thereto. The present invention can also be applied to the case in which each pixel circuit 48 includes four organic EL elements OLED(R), OLED(G), OLED(B), and OLED(W) as shown in FIG. 31, and one frame period is divided into four subframes upon the time-division driving mode. Note that the organic EL element OLED(W) functions as an electro-optical element that emits white light.

As shown in FIG. 31, in the present variant, each pixel circuit 48 is provided with a transistor T6 as a light-emission control transistor that performs light emission control by controlling the supply of a drive current to the organic EL element OLED(W). In addition, fourth emission lines EM4 are disposed in a display unit, in addition to first to third emission lines EM1 to EM3.

In the present variant, four pixel circuits 48 arranged side by side in the extension direction of the scanning signal lines SL are considered one group. Since the number of columns is m, (m/4) groups are formed for each row. Then, when the operating mode is the pause driving mode, one pixel is formed by four pixel circuits 48 included in each group.

Figure 32:
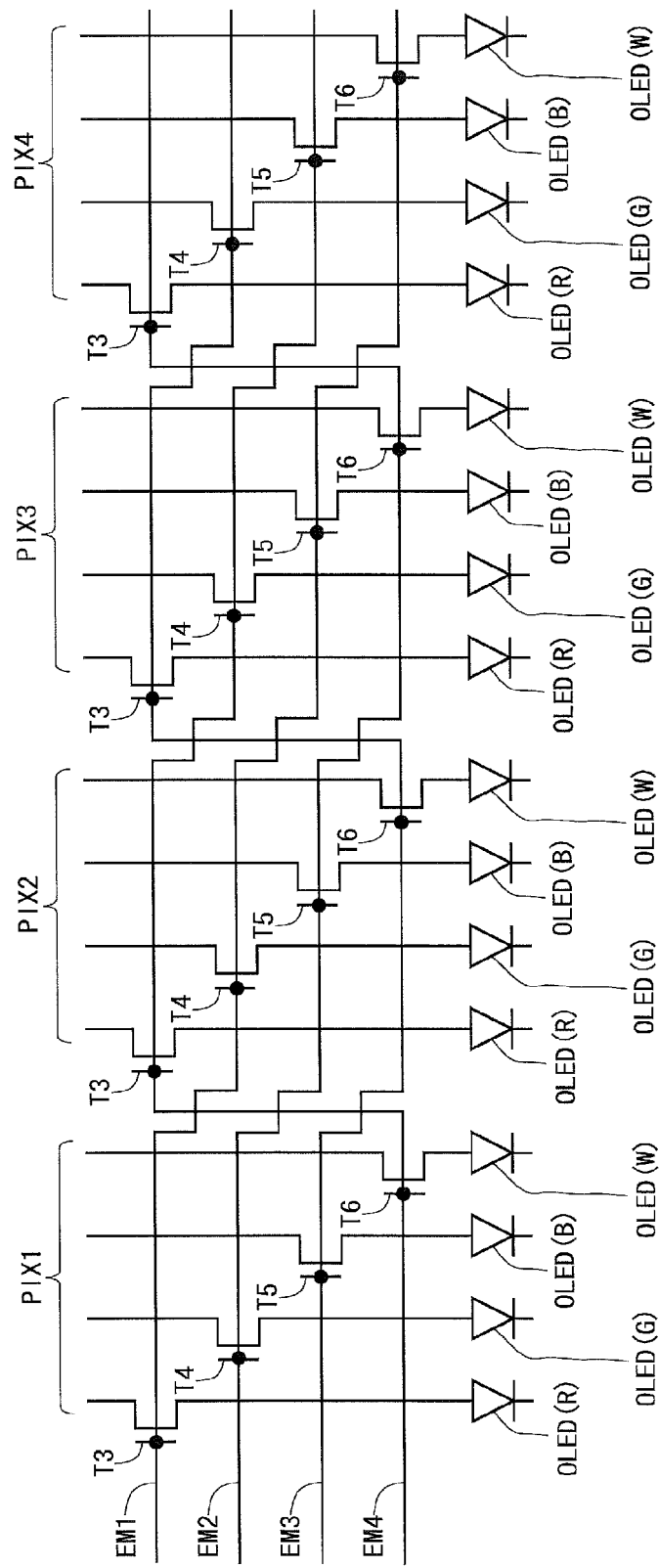
FIG. 32 is a diagram for describing a connection relationship between the gate terminals of transistors T3 to T6 included in four pixel circuits and first to fourth emission lines EM1 to EM4 in the fourth variant of the embodiment.
Figure 33:
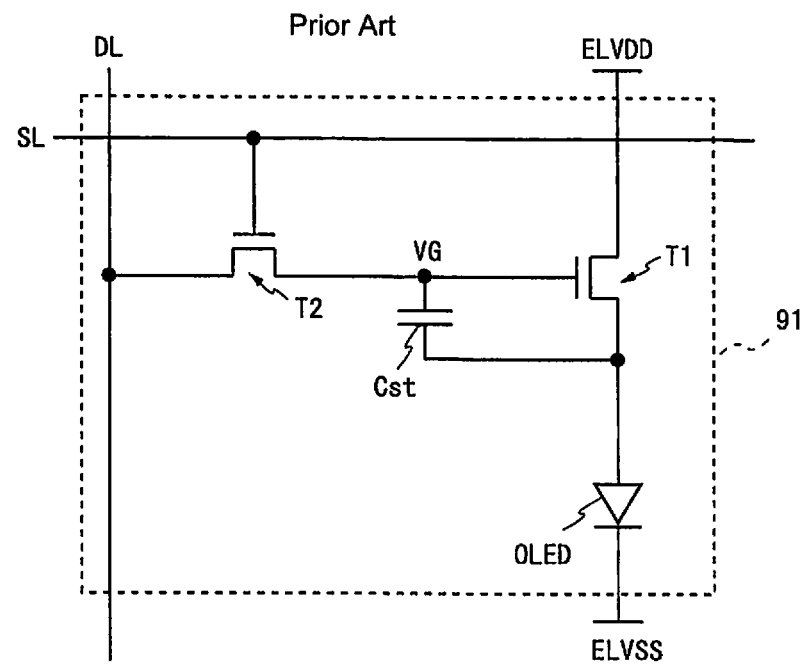
FIG. 33 is a circuit diagram showing a configuration of a conventional general pixel circuit forming one subpixel.
Figure 34:
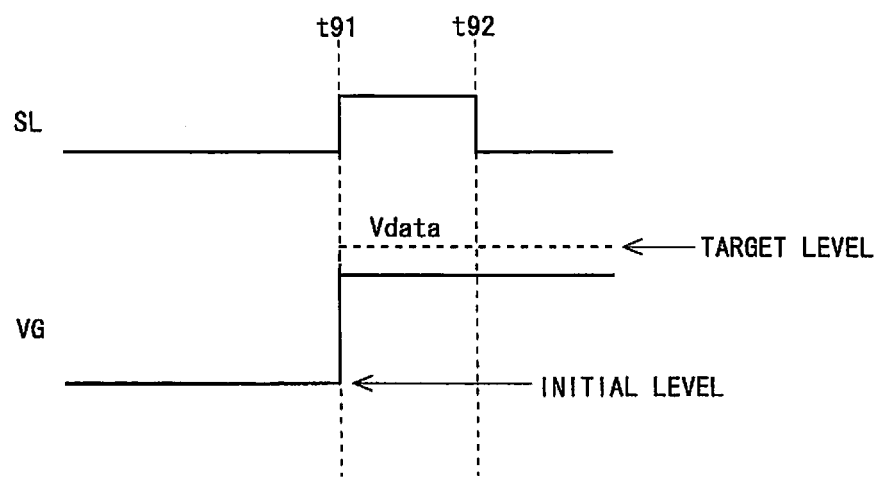
FIG. 34 is a timing chart for describing an operation of the pixel circuit shown in FIG. 33.
Figure 35:
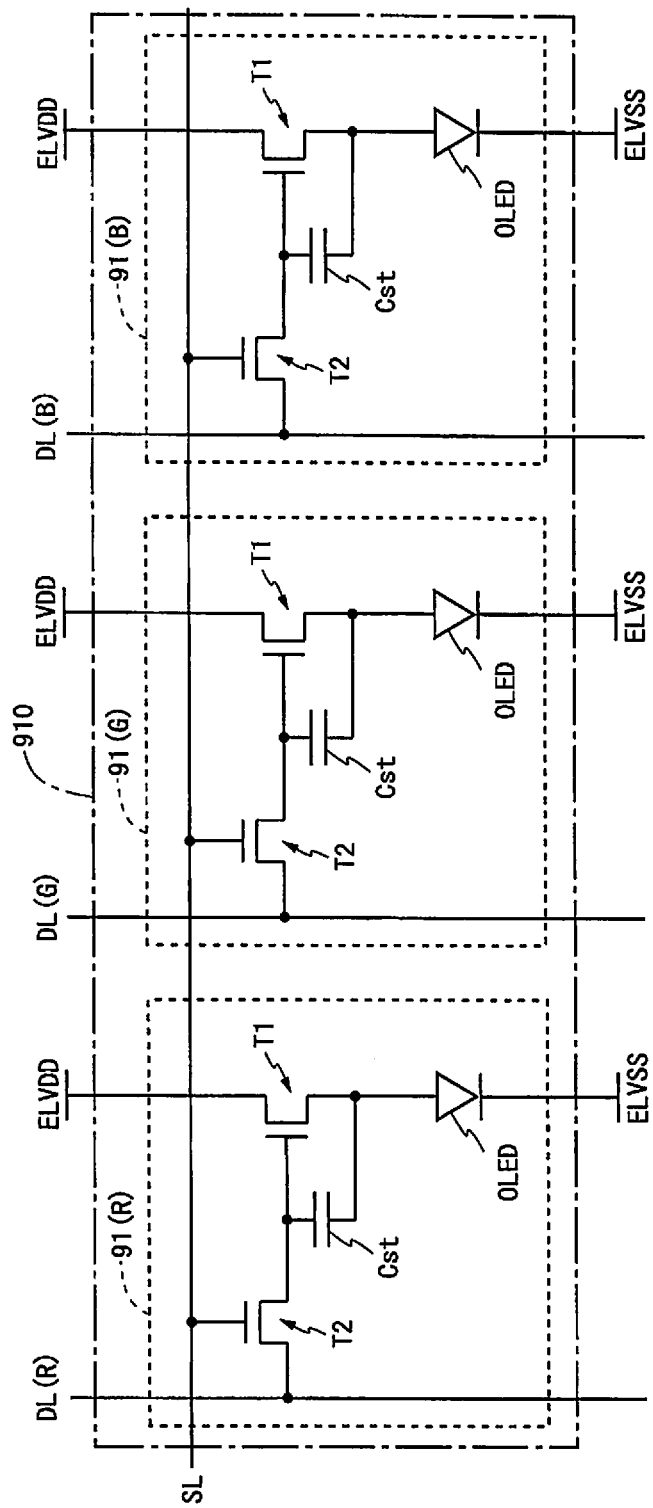
FIG. 35 is a circuit diagram showing a configuration of a pixel circuit corresponding to one pixel in a conventional example.
Figure 36:
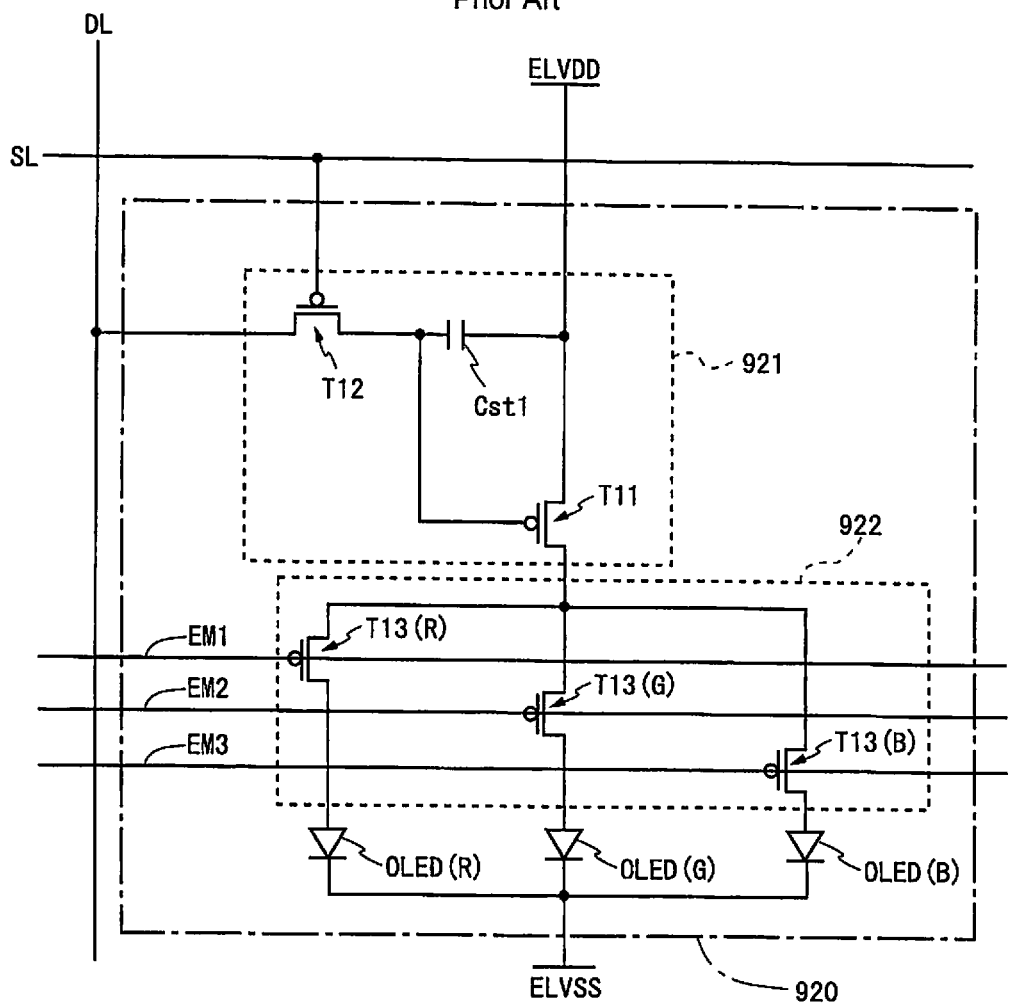
FIG. 36 is a circuit diagram showing a configuration of a pixel circuit corresponding to one pixel in an example disclosed in Japanese Patent Application Laid-Open No. 2005-148749.
Figure 37:
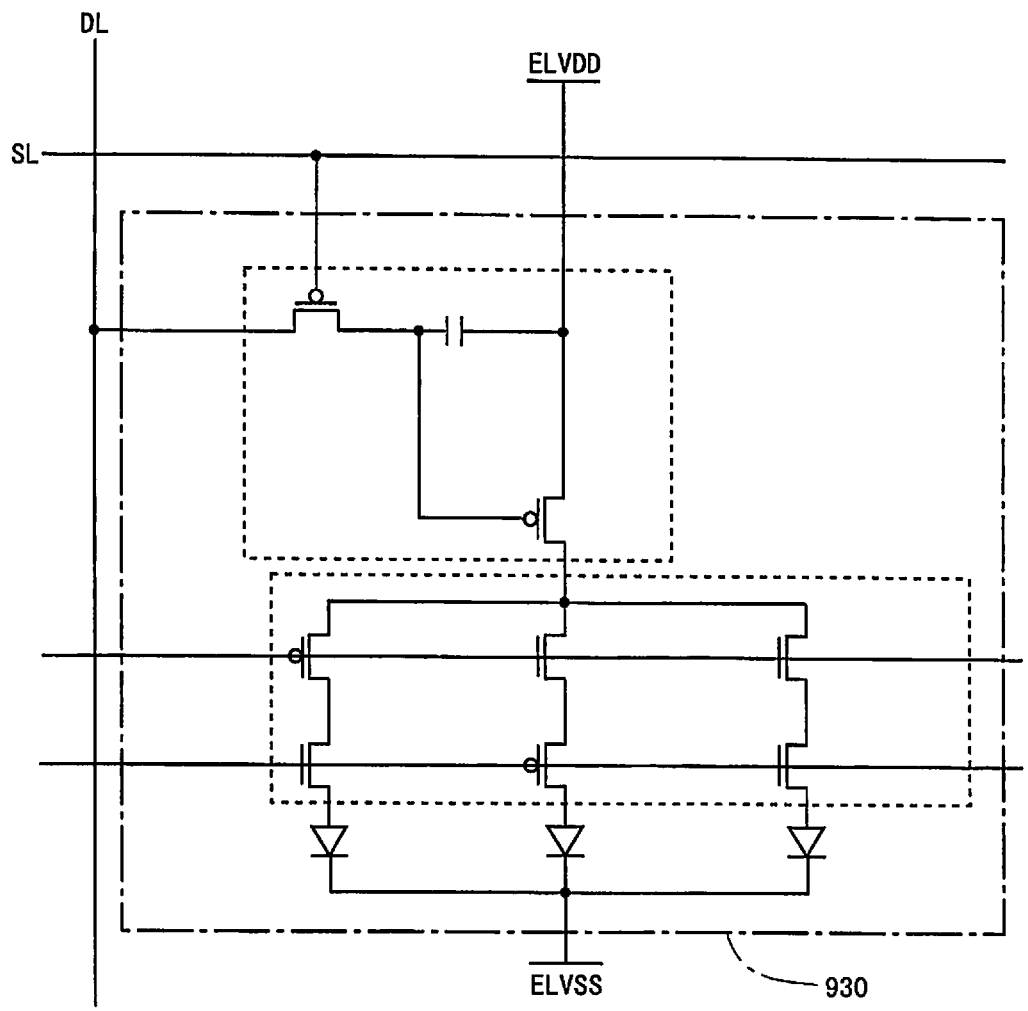
FIG. 37 is a circuit diagram showing a configuration of a pixel circuit corresponding to one pixel in an example disclosed in Japanese Patent Application Laid-Open No. 2005-148750.

FIG. 32 is a diagram for describing a connection relationship between the gate terminals of the transistors T3 to T6 included in four pixel circuits PIX1 to PIX4 and the first to fourth emission lines EM1 to EM4. Focusing on each pixel circuit, the gate terminals of the transistors T3 to T6 are connected to different emission lines EM. In addition, when focusing on the four pixel circuits PIX1 to PIX4 and the first to fourth emission lines EM1 to EM4, each emission line EM is connected to the gate terminals of light-emission control transistors corresponding to the organic EL elements OLED of different light-emitting colors in the four pixel circuits PIX1 to PIX4.

By allowing the peripheral drivers to operate in the same manner as in the above-described embodiment in the above-described configuration, also in an organic EL display device configured to include four organic EL elements OLED(R), OLED(G), OLED(B), and OLED(W) in each pixel circuit 48, power consumption can be reduced over the conventional one.

Note that as with the above-described first variant, one pixel may be formed by k×4 pixel circuits corresponding to k consecutive rows in the extension direction of the data lines DL upon the pause driving mode. In further generalization, one pixel may be formed by k×j pixel circuits (j is an integer greater than or equal to 3) which are included in k groups corresponding to k consecutive rows (k is an integer greater than or equal to 2). In this case, a still image with a 1/(k×j) resolution of an image displayed on the display unit when the operating mode is the time-division driving mode is displayed on the display unit.

<6. Others>

The present invention is not limited to the above-described embodiment and variants, and may be implemented by making various modifications thereto without departing from the true scope and spirit of the present invention. For example, although description is made using, as an example, an organic EL display device in the above-described embodiment and variants, the present invention can also be applied to display devices other than organic EL display devices as long as the display devices include self light-emitting type display elements which are driven by a current.

In addition, although n-channel transistors are used as the transistors in the pixel circuits 40, 46, and 48 (see FIGS. 8, 28, and 31) in the above-described embodiment and variants, p-channel transistors may be used.

DESCRIPTION OF REFERENCE CHARACTERS 1 and 2: ORGANIC EL DISPLAY DEVICE
7: ORGANIC EL PANEL
40, 46, and 48: PIXEL CIRCUIT
45 and 47: DRIVE CURRENT CONTROL UNIT
100: DISPLAY CONTROL CIRCUIT
110: OPERATING MODE SWITCHING CONTROL CIRCUIT
120: RESOLUTION SWITCHING CONTROL CIRCUIT
130: SOURCE CONTROL CIRCUIT
140: GATE CONTROL CIRCUIT
200: SOURCE DRIVER
300: GATE DRIVER
401 to 403: FIRST TO THIRD EMISSION DRIVERS
500 and 501: DISPLAY UNIT
T1: DRIVE TRANSISTOR
T2: INPUT TRANSISTOR
T3 to T6: LIGHT-EMISSION CONTROL TRANSISTOR
T7: REFERENCE VOLTAGE SUPPLY CONTROL TRANSISTOR
Cst: CAPACITOR
OLED(R): RED-COLOR ORGANIC EL ELEMENT (ELECTRO-OPTICAL ELEMENT)
OLED(G): GREEN-COLOR ORGANIC EL ELEMENT (ELECTRO-OPTICAL ELEMENT)
OLED(B): BLUE-COLOR ORGANIC EL ELEMENT (ELECTRO-OPTICAL ELEMENT)
DL and DL(1) to DL(m): DATA LINE
SL and SL(1) to SL(n): SCANNING SIGNAL LINE
EM: EMISSION LINE
EM1 and EM1(1) to EM1($n$): FIRST EMISSION LINE
EM2 and EM2(1) to EM2($n$): SECOND EMISSION LINE
EM3 and EM3(1) to EM3($n$): THIRD EMISSION LINE
ELVDD: HIGH-LEVEL POWER SUPPLY VOLTAGE AND HIGH-LEVEL POWER SUPPLY LINE
ELVSS: LOW-LEVEL POWER SUPPLY VOLTAGE AND LOW-LEVEL POWER SUPPLY LINE

The invention claimed is:

1. A display device, comprising:
a display unit, including pixel circuits arranged in a matrix form to form a plurality of rows and a plurality of columns, wherein
each of the pixel circuits includes j electro-optical elements of different light-emitting colors (j is an integer greater than or equal to 3),
an operating mode is switchable between
a time-division driving mode in which image display on the display unit is performed by dividing one frame period into j subframes and performing writing of image data to the pixel circuits on a subframe-by-subframe basis, and bringing, in each of the pixel circuits, electro-optical elements of different light-emitting colors into a light-emitting state on a subframe-by-subframe basis; and
a pause driving mode in which still image display on the display unit is performed at a lower refresh rate than that for when in the time-division driving mode, by repeating a refresh period during which writing of image data to the pixel circuits is performed and a pause period during which the writing of image data to the pixel circuits is brought into a pause state,
wherein when the operating mode is the pause driving mode, j pixel circuits are considered one group and electro-optical elements of different light-emitting colors in j pixel circuits included in each group are configured to be brought into a light-emitting state, by which a still image with a resolution not more than 1/j of a resolution of an image, displayable on the display unit when the operating mode is the time-division driving mode, is configured to be displayed on the display unit,
each of the pixel circuits further including:
j light-emission control transistors including a one-to-one correspondence with the j electro-optical elements; and a drive current control unit configured to control a drive current for bringing the j electro-optical elements into a light-emitting state, the display unit further including j light-emission control lines for each row, wherein in each of the pixel circuits, control terminals of the j light-emission control transistors are connected to different light-emission control lines, first conduction terminals of the j light-emission control transistors are connected to the drive current control unit, and second conduction terminals of the j light-emission control transistors are connected to corresponding electro-optical elements, wherein when focusing on j pixel circuits included in each group and j light-emission control lines corresponding to the j pixel circuits, each of the focused j light-emission control lines is connected to control terminals of light-emission control transistors corresponding to electro-optical elements of different light-emitting colors in the focused j pixel circuits, wherein when the operating mode is the lime-division driving mode, for each row, the j light-emission control lines are configured to be sequentially brought into a selected state on a subframe-by-subframe basis, and wherein when the operating mode is the pause driving mode, for each row, only one of the j light-emission control lines is configured to be brought into a selected state.

2. The display device according to claim 1, further comprising:

scanning signal lines disposed in the display unit, respectively corresponding to the respective rows;

data lines disposed in the display unit, respectively corresponding to the respective columns;

a first power supply line disposed in the display unit and configured to supply a high-level constant voltage to the pixel circuits;

a second power supply line disposed in the display unit and configured to supply a low-level constant voltage to the pixel circuits;

a reference voltage line disposed in the display unit and configured to supply a reference voltage to the pixel circuits;

a scanning signal line drive circuit configured to drive the scanning signal lines;

a data line drive circuit configured to drive the data lines; and a light-emission control line drive circuit configured to drive the light-emission control lines, wherein the drive current control unit includes:

a drive transistor provided between the first power supply line and the second power supply line, in series with each of the j light-emission control transistors, and configured to control the drive current;

a reference voltage supply control transistor provided between a control terminal of the drive transistor and the reference voltage line, and configured to electrically connect the control terminal of the drive transistor to the reference voltage line when a corresponding one of the scanning signal lines is brought into a selected state by the scanning signal line drive circuit;

an input transistor provided between one conduction terminal of the drive transistor and a corresponding one of the data lines, and configured to electrically connect the one conduction terminal of the drive transistor to the corresponding one of the data lines when the corresponding one of the scanning signal lines is brought into a selected state by the scanning signal line drive circuit; and a capacitor provided between the control terminal of the drive transistor and the one conduction terminal of the drive transistor, wherein during the refresh period, the light-emission control line drive circuit is configured to bring, for each row, only one of the j light-emission control lines into a selected state, the scanning signal line drive circuit is configured to sequentially bring the scanning signal lines disposed in the display unit into a selected state, and the data line drive circuit is configured to apply data voltages according to a still image to be displayed on the display unit during the pause driving mode, to the data lines, according to each of the scanning signal lines going into a selected state, and wherein during the pause period, the light-emission control line drive circuit is configured to keep the light-emission control line brought into the selected state during the refresh period, in the selected state and is configured to keep other light-emission control lines in a non-selected state, and the scanning signal line drive circuit and the data line drive circuit are configured to go into a pause state.

3. The display device according to claim 1, wherein a black display period during which the j electro-optical elements included in each of the pixel circuits are configured to be brought into a light-off state and image data corresponding to a black color is written to the pixel circuits is provided before the refresh period.

4. The display device according to claim 1, wherein when the operating mode is the pause driving mode, one pixel is formed by j pixel circuits included in one group, and a still image with a resolution equal to 1/j of a resolution of an image displayable on the display unit when the operating mode is the time-division driving mode is displayable on the display unit.

5. The display device according to claim 1, wherein the j electro-optical elements included in each of the pixel circuits are three organic electroluminescence elements having a red light-emitting color, a green light-emitting color, and a blue light-emitting color.

6. The display device according to claim 1, wherein the j electro-optical elements included in each of the pixel circuits are four organic electroluminescence elements having a red light-emitting color, a green light-emitting color, a blue light-emitting color, and a white light-emitting color.

7. The display device according to claim 1, wherein when the operating mode is the pause driving mode, one pixel is formed by k×j pixel circuits included in k groups corresponding to k consecutive rows (k is an integer greater than or equal to 2), and a still image with a resolution equal to 1/(k×j) of a resolution of an image displayable on the display unit when the operating mode is the time-division driving mode is displayable on the display unit.

8. The display device according to claim 7, wherein a value of the k is determinable such that a shape of each pixel for when the operating mode is the pause driving mode becomes a square.

9. The display device according to claim 1, wherein when focusing on j light-emission control lines corresponding to each row, a light-emission control line is configured to be brought into a selected state when the operating mode is the pause driving mode is changed as appropriate.

10. The display device according to claim 9, wherein the light-emission control line, configured to be brought into a selected state when the operating mode is the pause driving mode, is configured to be changed every time the operating mode is switched from the time-division driving mode to the pause driving mode.

11. The display device according to claim 1, further comprising:
    scanning signal lines disposed in the display unit, respectively corresponding to the respective rows;
    data lines disposed in the display unit, respectively corresponding to the respective columns;
    a first power supply line disposed in the display unit and configured to supply a high-level constant voltage to the pixel circuits;
    a second power supply line disposed in the display unit and configured to supply a low-level constant voltage to the pixel circuits;
    a scanning signal line drive circuit configured to drive the scanning signal lines;
    a data line drive circuit configured to drive the data lines; and
    a light-emission control line drive circuit configured to drive the light-emission control lines, wherein
    the drive current control unit includes:
        a drive transistor provided between the first power supply line and the second power supply line, in series with each of the j light-emission control transistors, and configured to control the drive current;
        an input transistor provided between a control terminal of the drive transistor and a corresponding one of the data lines, and configured to electrically connect the control terminal of the drive transistor to the corresponding one of the data lines when a corresponding one of the scanning signal lines is brought into a selected state by the scanning signal line drive circuit; and
        a capacitor provided between the control terminal of the drive transistor and one conduction terminal of the drive transistor,
    wherein during the refresh period,
        the light-emission control line drive circuit is configured to bring, for each row, only one of the j light-emission control lines into a selected state,
        the scanning signal line drive circuit is configured to sequentially bring the scanning signal lines disposed in the display unit into a selected state, and
        the data line drive circuit is configured to apply data voltages according to a still image to be displayed on the display unit during the pause driving mode, to the data lines, according to each of the scanning signal lines going into a selected state, and
    wherein during the pause period,
        the light-emission control line drive circuit is configured to keep the light-emission control line brought into the selected state during the refresh period, in the selected state and is configured to keep other light-emission control lines in a non-selected state, and
        the scanning signal line drive circuit and the data line drive circuit are configured to go into a pause state.

12. The display device according to claim 11, wherein the drive transistor, the input transistor, and the j light-emission control transistors are thin-film transistors whose channel layers are formed of an oxide semiconductor.

13. The display device according to claim 12, wherein main components of the oxide semiconductor are indium (In), gallium (Ga), zinc (Zn), and oxygen (O).

14. A driving method for a display device including a display unit in which pixel circuits are arranged in a matrix form to form a plurality of rows and a plurality of columns, each of the pixel circuits including j electro-optical elements of different light-emitting colors (j is an integer greater than or equal to 3), the method comprising:
    performing image display on the display unit by dividing one frame period into j subframes and performing writing of image data to the pixel circuits on a subframe-by-subframe basis, and bringing, in each of the pixel circuits, electro-optical elements of different light-emitting colors into a light-emitting state on a subframe-by-subframe basis; and
    performing still image display on the display unit at a relatively lower refresh rate than that for the performing of the image display, by repeating a refresh period during which writing of image data to the pixel circuits is performed and a pause period during which the writing of image data to the pixel circuits is brought into a pause state, wherein
    in the performing of the still image display, j pixel circuits are considered one group and electro-optical elements of different light-emitting colors in j pixel circuits included in each group are brought into a light-emitting state, by which a still image with a resolution not more than 1/j of a resolution of an image displayed on the display unit in the performing of the image display is displayed on the display unit,
    wherein each of the pixel circuits further includes:
        j light-emission control transistors provided to have a one-to-one correspondence with the j electro-optical elements, and
        a drive current control unit configured to control a drive current for bringing the j electro-optical elements into a light-emitting state,
    wherein the display unit includes j light-emission control lines for each row,
    wherein in each of the pixel circuits,
        control terminals of the j light-emission control transistors are connected to different light-emission control lines,
        first conduction terminals of the j light-emission control transistors are connected to the drive current control unit, and
        second conduction terminals of the j light-emission control transistors are connected to corresponding electro-optical elements,
    wherein when focusing on j pixel circuits included in each group and j light-emission control lines corresponding to the j pixel circuits, each of the focused j light-emission control lines is connected to control terminals of light-emission control transistors corresponding to electro-optical elements of different light-emitting colors in the focused j pixel circuits,
    wherein in the performing of the image display, for each row, the j light-emission control lines are sequentially brought into a selected state on a subframe-by-subframe basis, and
    wherein in the performing of the still image display, for each row, only one of the j light-emission control lines is brought into a selected state.

15. The driving method according to claim 14, wherein a black display period during which the j electro-optical elements included in each of the pixel circuits are configured to be brought into a light-off state and image data corresponding to a black color is written to the pixel circuits is provided before the refresh period.

16. The driving method according to claim 14, wherein in the performing of the still image display, one pixel is formed by j pixel circuits included in one group, and a still image with a resolution equal to 1/j of a resolution of an image displayed on the display unit in the performing of the image display on the display unit.

17. The driving method according to claim 14, wherein in the performing of the still image display, one pixel is formed by k×j pixel circuits included in k groups corresponding to k consecutive rows (k is an integer greater than or equal to 2), and a still image with a resolution equal to 1/(k×j) of a resolution of an image displayed on the display unit in the performing of the image display on the display unit.

18. The driving method according to claim 14, wherein the j electro-optical elements included in each of the pixel circuits are three organic electroluminescence elements having a red light-emitting color, a green light-emitting color, and a blue light-emitting color.

19. The driving method according to claim 14, wherein the j electro-optical elements included in each of the pixel circuits are four organic electroluminescence elements having a red light-emitting color, a green light-emitting color, a blue light-emitting color, and a white light-emitting color.

* * * * *